(12) United States Patent
Oyama et al.

(10) Patent No.: US 9,136,152 B2
(45) Date of Patent: Sep. 15, 2015

(54) SUBSTRATE TRANSPORT APPARATUS, SUBSTRATE TRANSPORT METHOD, AND RECORDING MEDIUM

(75) Inventors: Katsuhiko Oyama, Iwate (JP); Yasushi Takeuchi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 810 days.

(21) Appl. No.: 13/410,447

(22) Filed: Mar. 2, 2012

(65) Prior Publication Data
US 2012/0230808 A1    Sep. 13, 2012

(30) Foreign Application Priority Data
Mar. 7, 2011   (JP) .................................. 2011-049195

(51) Int. Cl.
| | | |
|---|---|---|
| H01L 21/677 | (2006.01) | |
| C23C 16/458 | (2006.01) | |
| H01L 21/673 | (2006.01) | |
| H01L 21/687 | (2006.01) | |

(52) U.S. Cl.
CPC ...... *H01L 21/67742* (2013.01); *C23C 16/4583* (2013.01); *H01L 21/67303* (2013.01); *H01L 21/67309* (2013.01); *H01L 21/67766* (2013.01); *H01L 21/67781* (2013.01); *H01L 21/68707* (2013.01); *H01L 21/67757* (2013.01)

(58) Field of Classification Search
CPC .................. H01L 21/68707; H01L 21/68728; H01L 21/68771; H01L 21/67742; H01L 21/67754; H01L 21/67766; B05C 13/00; B65G 49/07; C23C 14/50; C23C 14/505; B65H 31/3081; B25J 15/0052; B25J 15/0014; G03F 7/70691; G03F 7/70633; B23Q 7/048; B25H 3/06
See application file for complete search history.

(56) References Cited

U.S. PATENT DOCUMENTS

| | | | | |
|---|---|---|---|---|
| 5,564,889 | A * | 10/1996 | Araki | 414/806 |
| 5,788,447 | A * | 8/1998 | Yonemitsu et al. | 414/217 |
| 8,545,165 | B2 * | 10/2013 | Moura et al. | 414/783 |
| 2005/0062465 | A1* | 3/2005 | De Ridder | 324/158.1 |
| 2007/0199860 | A1* | 8/2007 | Asari et al. | 206/710 |
| 2008/0260500 | A1* | 10/2008 | Meulen | 414/217 |
| 2009/0252580 | A1* | 10/2009 | Takizawa et al. | 414/222.02 |
| 2010/0243168 | A1* | 9/2010 | Nakano et al. | 156/345.54 |
| 2010/0290886 | A1* | 11/2010 | Hashimoto et al. | 414/800 |

FOREIGN PATENT DOCUMENTS

| | | |
|---|---|---|
| JP | 2009-081259 | 4/2009 |
| JP | 2009-099918 | 5/2009 |

* cited by examiner

*Primary Examiner* — Glenn Myers
(74) *Attorney, Agent, or Firm* — IPUSA, PLLC

(57) ABSTRACT

A substrate transport apparatus includes a first fork which is disposed to be movable in a forward/backward direction to a substrate holding part to transport a stacked member to or receive the stacked member from the substrate holding part. A second fork is arranged to be reversible and disposed above the first fork to be movable in a forward/backward direction to an accommodating part that accommodates substrates and spacer members to transport a substrate or a spacer member between the accommodating part and the first fork. A first grip module is disposed on a first surface of the second fork to hold and support the substrate from an upward direction. A second grip module is disposed on the first surface of the second fork on the same side as the first grip module to hold and support the spacer member from an upward direction.

7 Claims, 25 Drawing Sheets

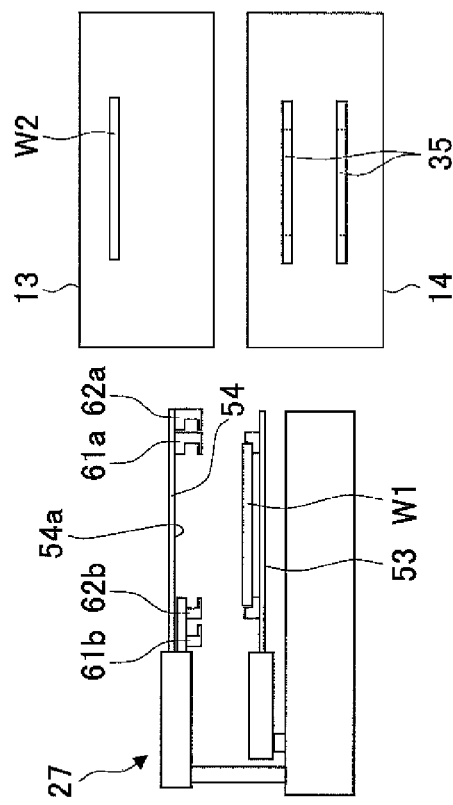
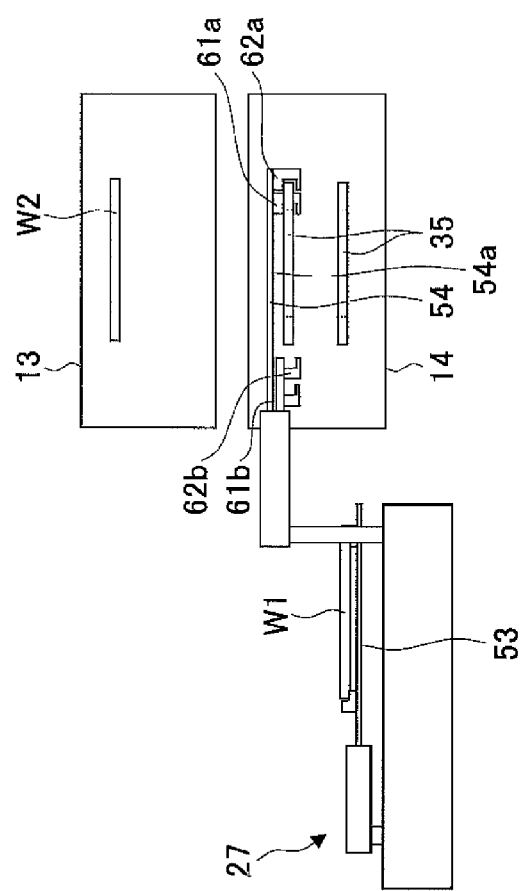
FIG.15A
FIG.15B

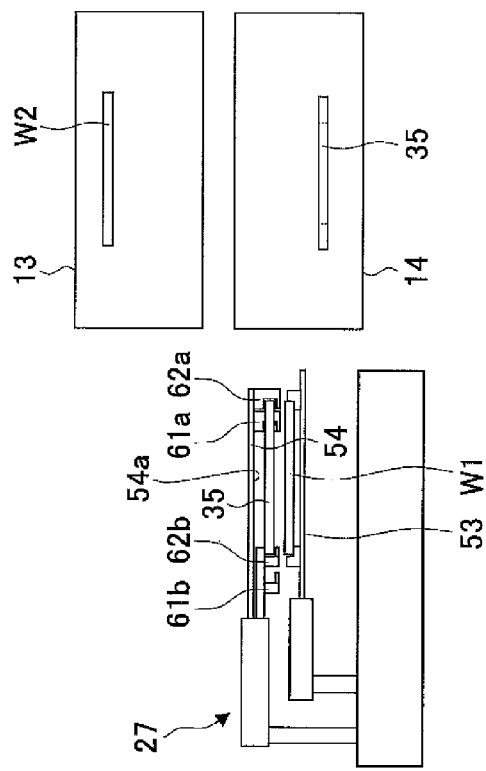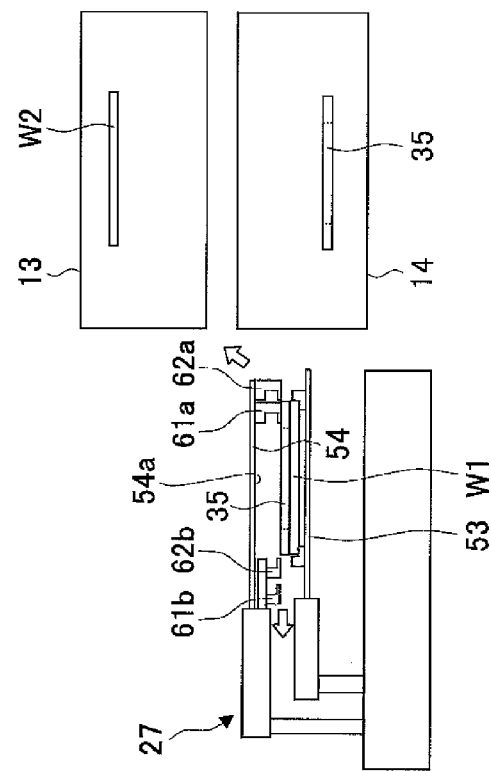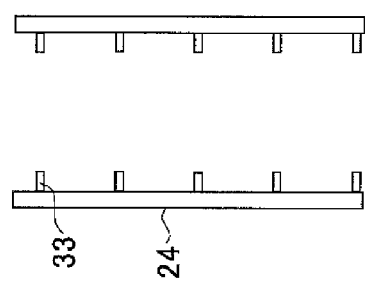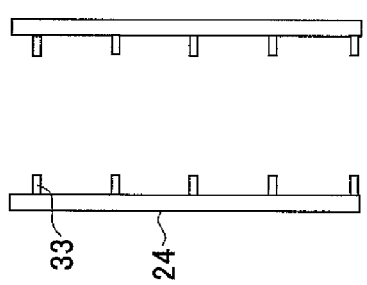
FIG.16B
FIG.16C

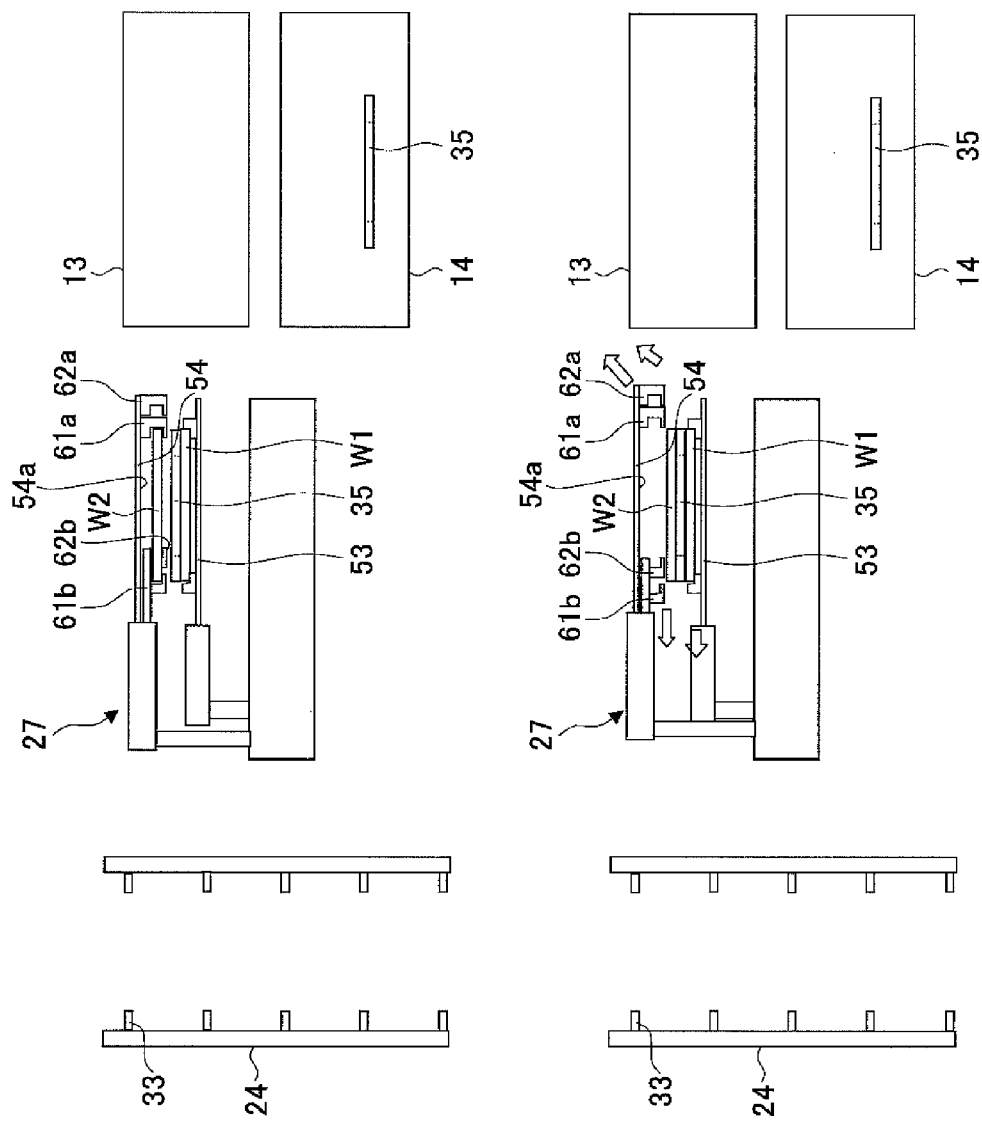

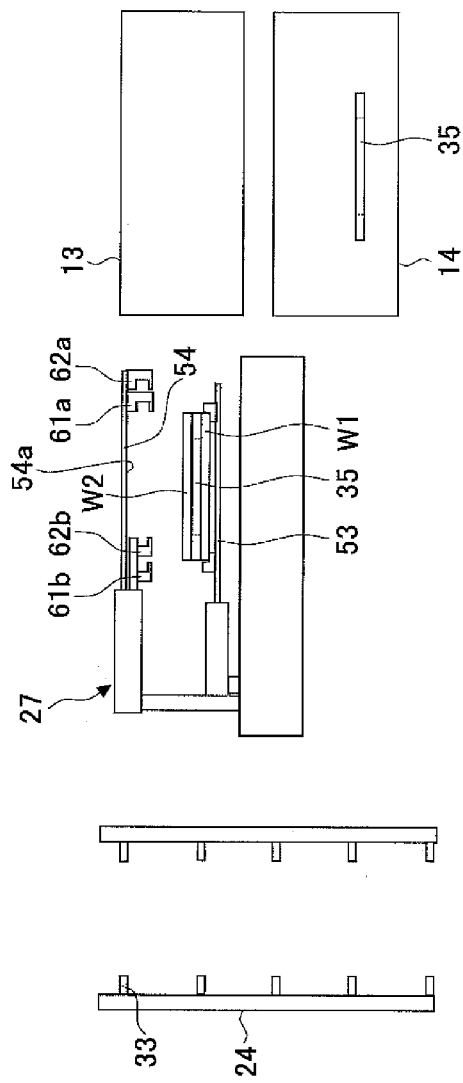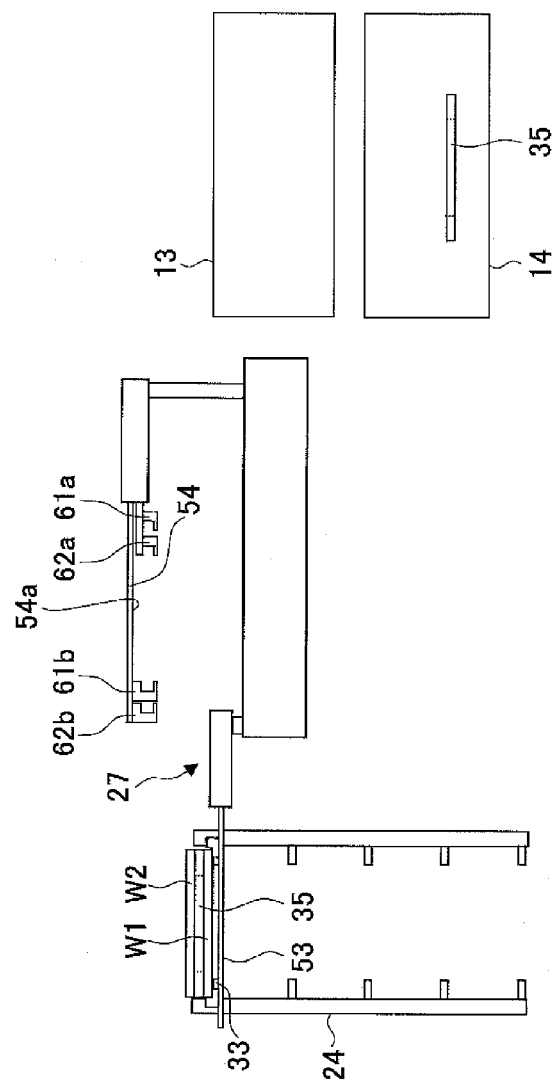
FIG.19A
FIG.19B

SUBSTRATE TRANSPORT APPARATUS, SUBSTRATE TRANSPORT METHOD, AND RECORDING MEDIUM

CROSS-REFERENCE TO RELATED APPLICATION

This application is based upon and claims the benefit of priority of Japanese patent application No. 2011-049195, filed on Mar. 7, 2011, the entire contents of which are incorporated by reference in their entirety.

BACKGROUND OF THE INVENTION

1. Field of the Invention

This invention relates to a substrate transport apparatus and a substrate transport method which are adapted to transport a substrate, and a recording medium storing a program for performing the substrate transport method.

2. Description of the Related Art

In manufacture of semiconductor devices, various kinds of processing devices are used to process oxidization, diffusion, CVD (chemical vapor deposition), etc. of a substrate, such as a semiconductor wafer. Among such devices, a film deposition apparatus including a vertical type heat-treatment device that can heat-treat a plurality of substrates simultaneously is known.

The film deposition apparatus includes a boat, a lifting/lowering module, and a transfer module (or a substrate transport apparatus). The boat is a substrate holding part that holds a plurality of substrates at predetermined holding intervals in an up/down direction (or a vertical direction), and this substrate holding part is transported to or from a film-deposition container.

The lifting/lowering module is disposed in a loading area under the film-deposition container. When the boat is disposed on an upper part of a lid for enclosing the opening of the film-deposition container, the lifting/lowering module lifts or lowers the lid in the vertical direction so that the boat goes up or down between the film-deposition container and the loading area. The transfer module transfers a substrate between the boat in the loading area and the accommodating container which accommodates the substrates.

Among various film deposition methods using the film deposition apparatus, a method of forming a polyimide film on a surface of a substrate is known. The polyimide film formed on the surface of the substrate can be used as an insulating layer in a semiconductor device. For example, a typical method of forming a polyimide film in which pyromellitic dianhydride (PMDA) and 4,4'-oxydianiline (ODA) are used as source material monomers and a polyimide film is formed by vapor deposition polymerization of PMDA and ODA is known.

In order to increase the number of substrates loaded in one boat in the film deposition apparatus of this type, a plurality of stacked members in which each staked member includes two substrates with adjacent back surfaces stacked via a spacer member are held on the boat at predetermined holding intervals in an up/down direction. For example, see Patent Document 1 listed below.

Among the various processing devices for manufacture of semiconductor devices, a substrate transport apparatus is known. In this substrate transport apparatus, when a substrate is transported between an accommodating container for accommodating substrates and a substrate holding part, the substrate is clamped by a stopper member and a clamp unit. For example, see Patent Document 2 listed below.

In the substrate transport apparatus of Patent Document 2, the stopper member is disposed at a front end of a fork to contact the outer edge of the substrate. The clamp unit is disposed on the base end side of the fork to be movable in forward and backward directions. The clamp unit is moved to push the substrate to the stopper member and clamps the substrate with the stopper member.

Patent Document 1: Japanese Laid-Open Patent Publication No. 2009-081259

Patent Document 2: Japanese Laid-Open Patent Publication No. 2009-099918

However, the transfer module (or the substrate transport apparatus) in the film deposition apparatus including the boat holding the stacked members has the following problems.

The substrate and the spacer member, forming the stacked member, have almost the same diameter, but other dimensions of the two elements, such as a thickness, are different from each other. In order to enable the same fork to support both the substrate and the spacer member, it is necessary to provide a substrate supporting module and a spacer-member supporting module in the same fork.

However, if the substrate supporting module and the spacer-member supporting module are arranged on one surface of the fork, the substrate may interfere with the spacer-member supporting module when the substrate is supported by the substrate supporting module. On the other hand, when the spacer member is supported by the spacer-member supporting module, the spacer member may interfere with the substrate supporting module.

Conversely, if the substrate supporting module and the space-member supporting module are arranged on the opposite surfaces of the fork, the thickness of the entire fork is increased and becomes larger than the thickness of the fork in the case in which the substrate supporting module and the spacer-member supporting module are arranged on only one surface of the fork.

During the condition when one substrate or one spacer member is transported between the boat and the accommodating container, to prevent interference between the adjacent substrates or the adjacent spacer members in the up/down direction, the intervals of the substrates or the intervals of the spacer members accommodated in the accommodating container must be enlarged.

SUMMARY OF THE INVENTION

In one aspect, the present disclosure provides a substrate transport apparatus and a substrate transport method which are adapted to support both the substrate and the spacer member with one fork (or the same fork) and reduce the intervals of the substrates or the spacer members accommodated in the accommodating container.

In one aspect, the present disclosure provides a substrate transport apparatus which transports a stacked member to a substrate holding part containing a plurality of stacked members, each stacked member including two substrates with adjacent back surfaces thereof stacked via a spacer member, where the plurality of stacked members are held at predetermined intervals in an up/down direction, the substrate transport apparatus including: a first fork disposed to be movable in a forward/backward direction to the substrate holding part to transport the stacked member to or receive the stacked member from the substrate holding part; a second fork arranged to be reversible and disposed above the first fork to be movable in a forward/backward direction to an accommodating part that accommodates the substrates and the spacer members, to transport a substrate or a spacer member between the accommodating part and the first fork; a first grip module disposed on a first surface of the second fork to hold and support the substrate from an upward direction; and a second grip module disposed on the first surface of the second fork on the same side as the first grip module to hold and support the spacer member from an upward direction.

In one aspect, the present disclosure provides a substrate transport method for transporting a stacked member to a substrate holding part containing a plurality of stacked members, each stacked member including two substrates with adjacent back surfaces thereof stacked via a spacer member, where the plurality of stacked members are held at predetermined intervals in an up/down direction, the substrate transport method including: a first step of holding, by a first grip module disposed on a first surface of a second fork disposed above a first fork, a first substrate contained in an accommodating part from a downward direction and placing the first substrate on the first fork by turning the second fork upside down; a second step of holding, by a second grip module disposed on the first surface of the second fork on the same side as the first grip module, a spacer member contained in the accommodating part from an upward direction and placing the spacer member on the first substrate placed on the first fork; and a third step of holding, by the first grip module, a second substrate contained in the accommodating part from an upward direction and placing the second substrate on the spacer member placed over the first fork.

The aspects and advantages of the invention will be realized and attained by means of the elements and combinations particularly pointed out in the claims. It is to be understood that both the foregoing general description and the following detailed description are exemplary and explanatory and are not restrictive of the invention as claimed.

BRIEF DESCRIPTION OF THE DRAWINGS

FIG. 16A, FIG. 16B and FIG. 16C are side views showing the procedure in which the transfer module constitutes and transports the plural-substrate unit.

FIG. 18A, FIG. 18B and FIG. 18C are side views showing the procedure in which the transfer module constitutes and transports the plural-substrate unit.

FIG. 19A, FIG. 19B and FIG. 19C are side views showing the procedure in which the transfer module constitutes and transports the plural-substrate unit.

DETAILED DESCRIPTION OF PREFERRED EMBODIMENTS

Figure 1:
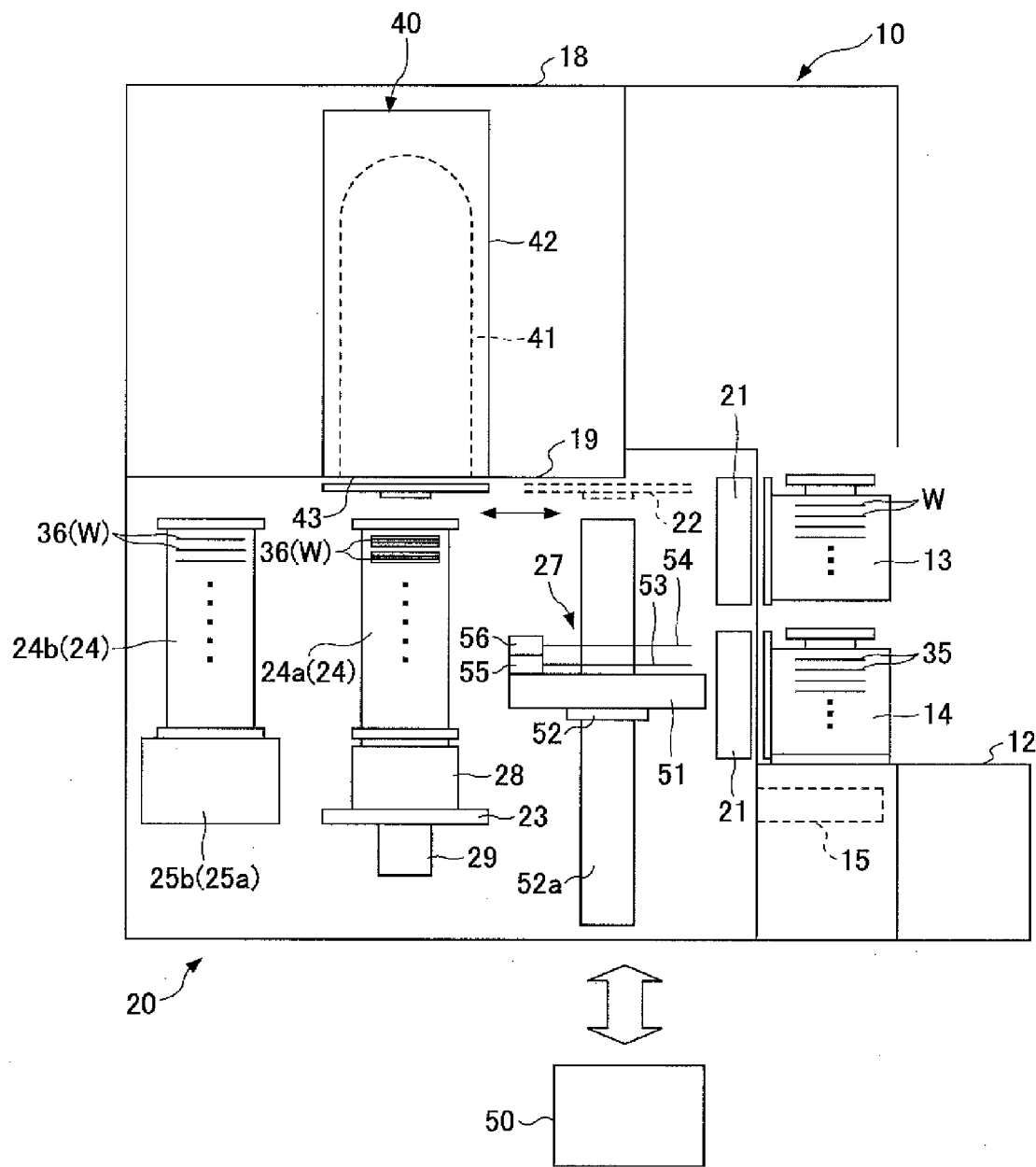
FIG. 1 is a longitudinal cross-sectional view of a film deposition apparatus of one embodiment of the present disclosure.

Non-limiting, exemplary embodiments of the present disclosure will now be described with reference to the accompanying drawings. In the drawings, the same or corresponding reference marks are given to the same or corresponding members or components. It is noted that the drawings are illustrative of the present disclosure, and there is no intention to indicate scale or relative proportions among the members or components. Therefore, the specific size should be determined by a person having ordinary skill in the art in view of the following non-limiting embodiments.

A description will be given of embodiments of the present disclosure with reference to the accompanying drawings.

A film deposition apparatus of one embodiment of the present disclosure will be described with reference to FIGS. 1 through 6.

In the film deposition apparatus of this embodiment, a substrate transport apparatus of the present disclosure is included, and a film is formed on a substrate (which will be called a substrate or a wafer W) from a plurality of stacked members by batch processing.

In a typical example of the film deposition apparatus of this embodiment, a polyimide film is formed on a substrate held in a film-deposition container by supplying to the substrate a first source gas into which pyromellitic dianhydride (PMDA) is evaporated and a second source gas into which 4,4'-oxydianiline (ODA) is evaporated.

Figure 2:
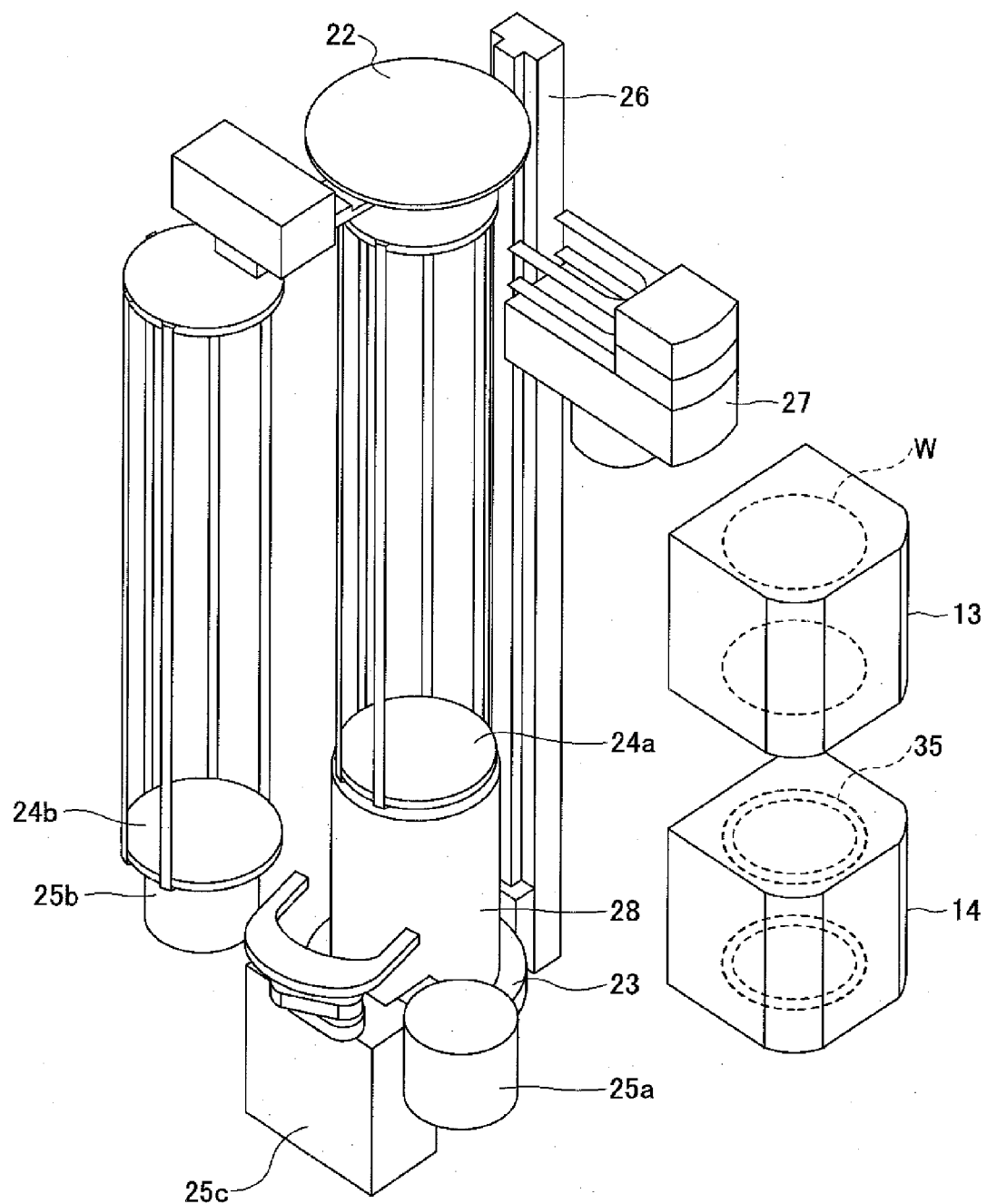
FIG. 2 is a perspective view of a loading area of the film deposition apparatus.
Figure 3:
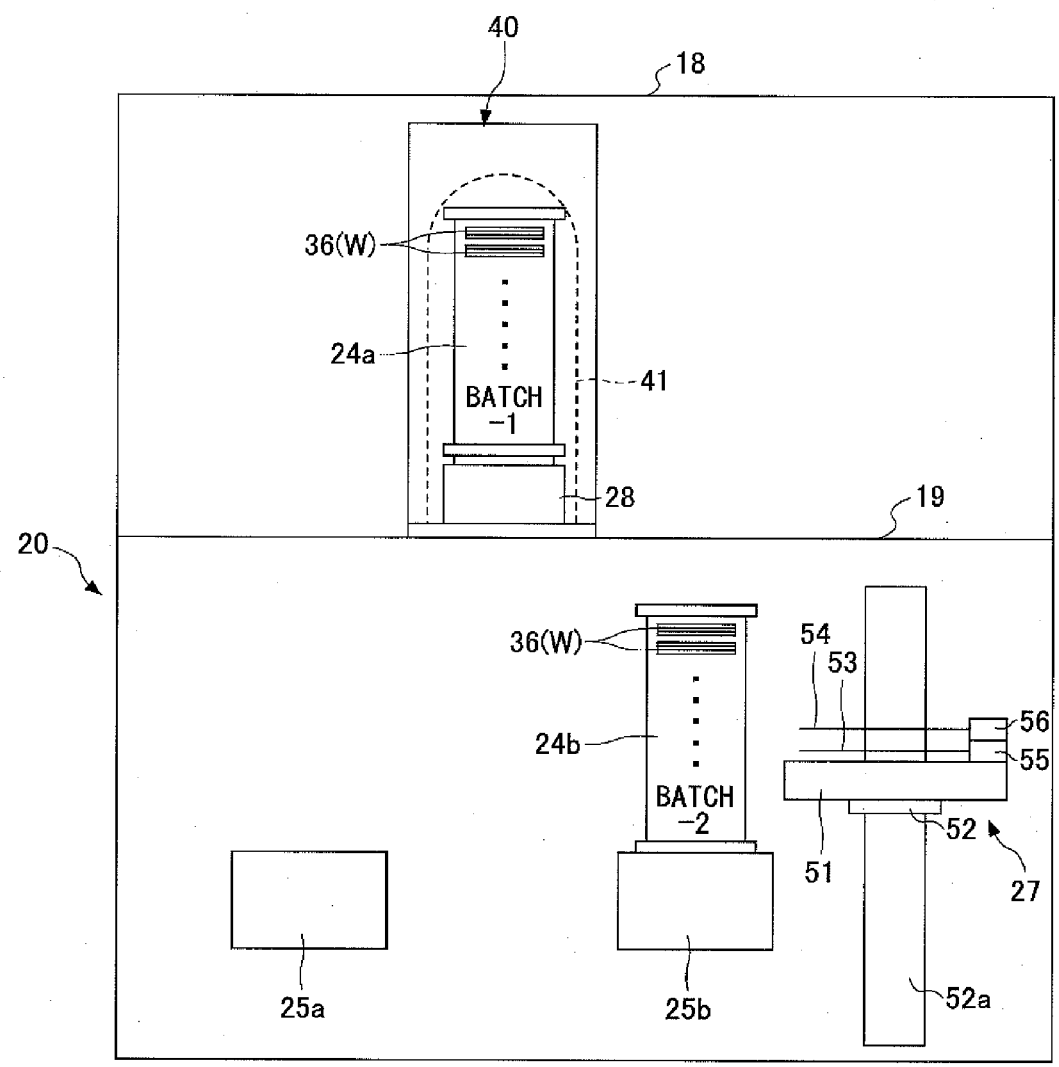
FIG. 3 is a diagram showing the state of the wafer of a following batch when a film deposition processing of the wafer of a preceding batch is performed in the film-deposition container.

FIG. 1 is a longitudinal cross-sectional view of the film deposition apparatus 10 of this embodiment. FIG. 2 is a perspective view of a loading area 20. FIG. 3 is a diagram showing the state of the wafer W of a following batch (batch 2) when a film deposition process of the wafer W of a preceding batch (batch 1) is carried out in a film-deposition container.

Figure 4:
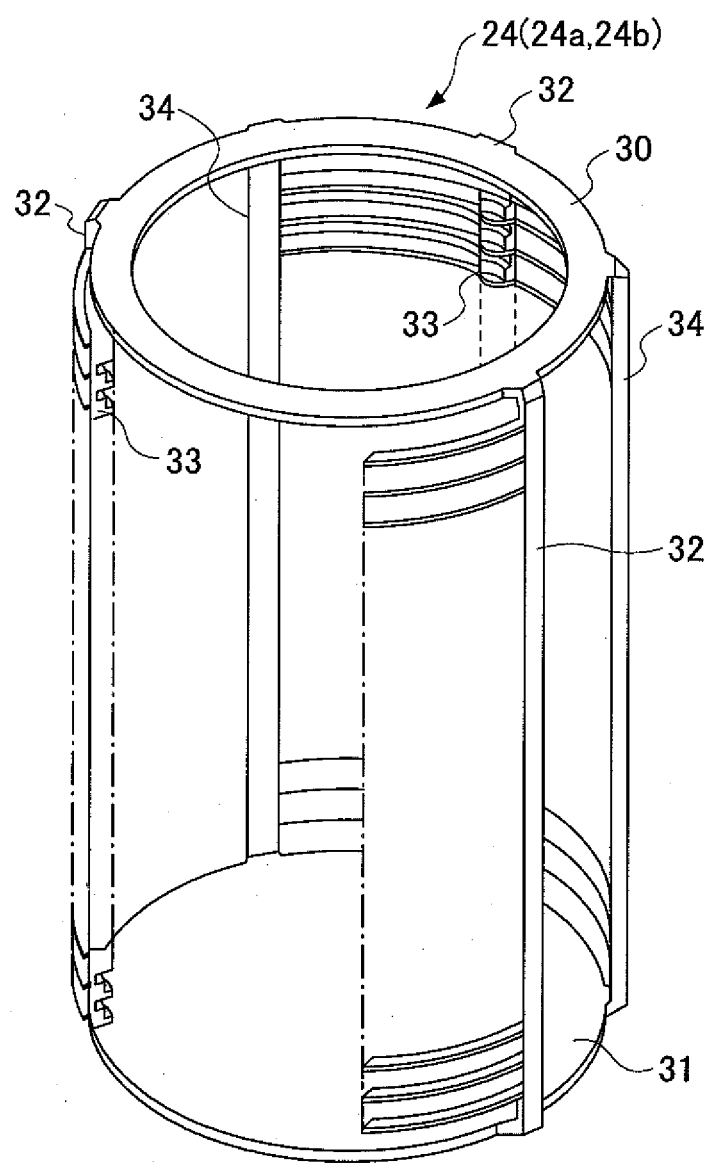
FIG. 4 is a perspective view of an example of a boat.
Figure 5:
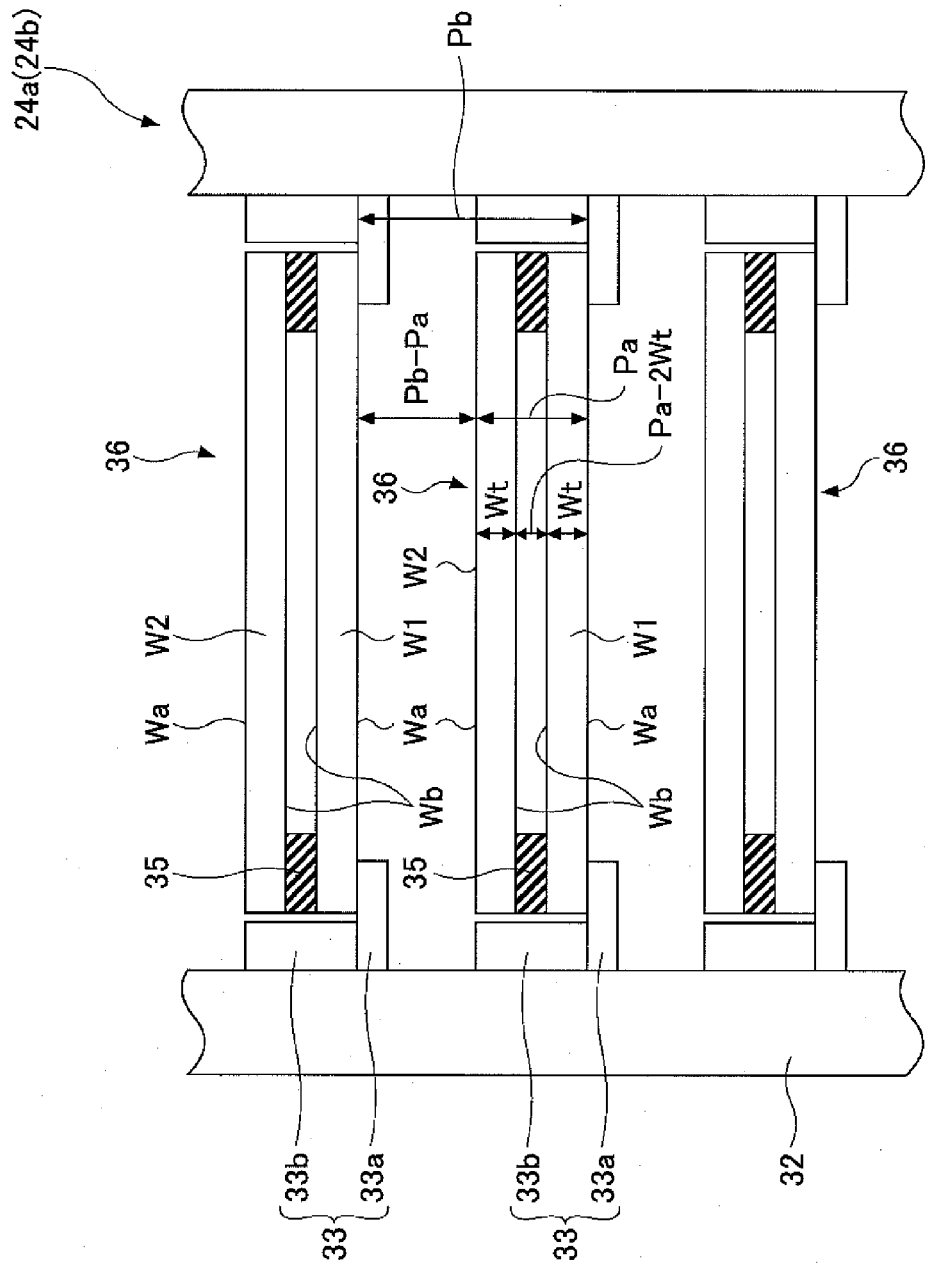
FIG. 5 is a cross-sectional view of the state where plural-substrate units are installed on the boat.
Figure 6:
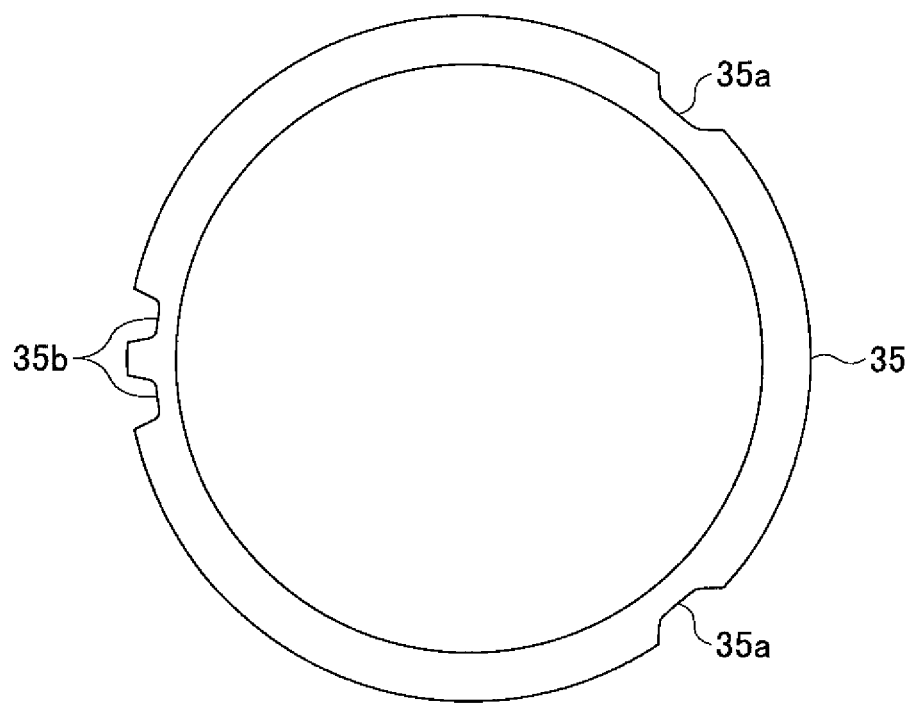
FIG. 6 is a plan view of an example of a spacer member.
Figure 7:
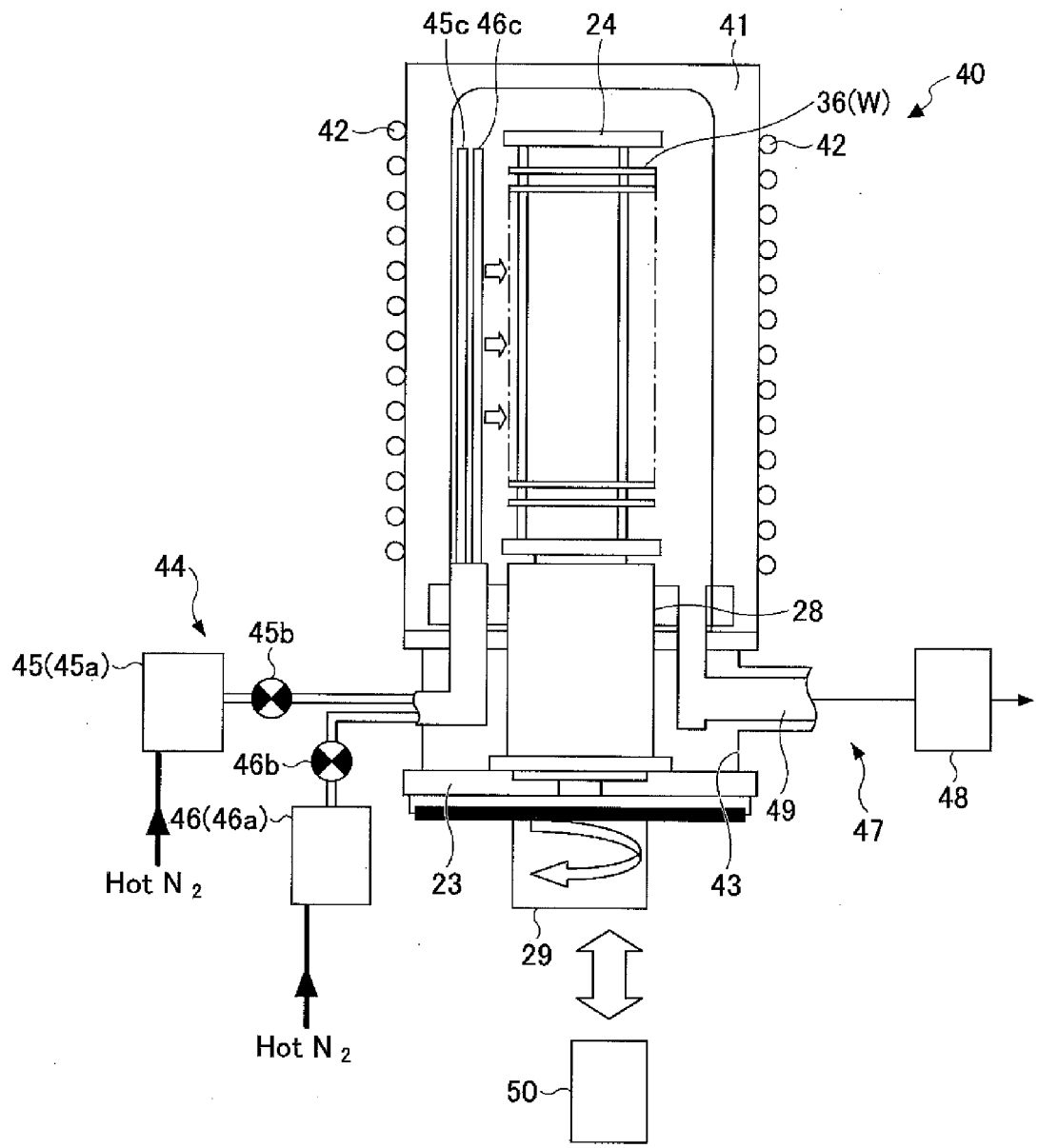
FIG. 7 is an enlarged diagram showing a film-deposition container.

FIG. 4 is a perspective view of an example of a boat 24. FIG. 5 is a cross-sectional view of the state where plural-substrate units 36 are installed on the boat 24. FIG. 6 is a plan view of an example of a spacer member 35. FIG. 7 is an enlarged diagram showing a film-deposition container 40.

As shown in FIG. 1, the film deposition apparatus 10 includes a mounting base (load port) 12, a housing 18, and a control unit 50.

The mounting base (load port) 12 is disposed in the front part of the housing 18. The housing 18 includes a loading area (workspace) 20 and a film-deposition container 40. The loading area 20 is arranged below the housing 18, and the film-deposition container 40 is arranged in the housing 18 and disposed above the loading area 20.

The base plate 19 is formed between the loading area 20 and the film-deposition container 40. The base plate 19 is a base plate made of SUS for installing reaction gas tube 41 in the film-deposition container 40, and is formed with the opening (not illustrated) for inserting a reaction gas tube 41 from the lower part to the upper part.

The mounting base (load port) 12 is provided for performing inward and outward transport of the wafer W to and from the housing 18. The accommodating container 13 is arranged in the mounting base (load port) 12. The accommodating container 13 is an encapsulated type accommodating container (hoop) containing a plurality of wafers (for example, 50 wafers) stacked at predetermined intervals, and provided with a detachably attached lid (not illustrated) on the front surface thereof.

In this embodiment, the mounting base (load port) 12 is provided for performing inward and outward transport of the spacer member 35 into the housing 18 described later.

The accommodating container 14 is arranged in the mounting base (load port) 12. The accommodating container 14 is an encapsulated type accommodating container (hoop) containing a plurality of spacer members 35 (for example, 25 pieces) stacked at predetermined intervals, and provided with a detachably attached lid (not illustrated) on the front surface thereof.

The accommodating containers 13 and 14 are equivalent to the accommodating part according to the present disclosure. An arraying device (aligner) 15 may be arranged under the mounting base 12 for arraying in one direction the notches formed in the peripheral portion of the wafer W transferred by a transfer module 27 (which will be described later).

The loading area (workspace) 20 is provided for transporting the wafer W between the accommodating container 13 and the boat 24 (which will be described later), loading the boat 24 in the film-deposition container 40, and unloading the boat 24 from the film-deposition container 40.

A door 21, a shutter module 22, a lid 23, the boat 24, bases 25a and 25b, a lifting/lowering module 26 (see FIG. 2), and a transfer module 27 are disposed in the loading area 20.

The lid 23 and the boat 24 are equivalent to the substrate holding part according to the present disclosure. The transfer module 27 is equivalent to the substrate transport apparatus according to the present disclosure.

The door 21 is provided for removing each lid of the accommodating containers 13 and 14 to make the inside pressure of the accommodating container 13 and 14 open to the loading area 20. The shutter module 22 is arranged above the loading area 20. The shutter module 22 is provided for closing the opening 43 of the film-deposition container 40 to prevent the heat in the hot furnace from being emitted to the loading area 20 when the lid 23 is open.

The lid 23 includes a heat insulating cylinder 28 and a rotation module 29. The heat insulating cylinder 28 is disposed on the lid 23. The heat insulating cylinder 28 is for the boat 24 to prevent being cooled by the heat transfer by the side of the lid 23, and to keep the boat 24 warm. The rotation module 29 is attached to the lower part of the lid 23. The rotation module 29 is for rotating the boat 24. The axis of rotation of the rotation module 29 penetrates the lid 23 in an airtight manner, and it is arranged so that the rotating table (not illustrated) arranged on the lid 23 may be rotated.

The lifting/lowering module 26 performs the lifting/lowering drive of the lid 23 on the occasion of carrying in and taking out to the film-deposition container 40 from the loading area 20 of the boat 24. When the lid 23 lifted by the lifting/lowering module 26 is transported the film-deposition container 40, the lid 23 is arranged so that opening 43 may be sealed in contact with opening 43 described later. The boat 24 arranged in the lid 23 can hold the wafer W to be pivotable on the horizontal surface within the film-deposition container 40.

Alternatively, the film deposition apparatus 10 may be provided with plurality of boats 24. In the following, it is supposed that the film deposition apparatus 10 of this embodiment is provided with two boats 24, and a description thereof will be given with reference to FIG. 2.

As shown in FIG. 2, boats 24a and 24b are disposed in the loading area 20. In the loading area 20, bases 25a and 25b and a boat transport module 25c are disposed. The bases 25a and 25b are mounting bases on which the boats 24a and 24b transferred from the lid 23 are mounted respectively.

The boat transport module 25c is provided for transporting the boats 24a and 24b to the bases 25a and 25b from the lid 23. As shown in FIG. 3, when the boat 24a in which the wafer W of the preceding batch (batch 1) is contained is transported to the film-deposition container 40 and the film deposition process is performed, the wafer W of the following batch (batch 2) can be transferred from the accommodating container 13 to the boat 24b in the loading area 20.

At the end of the film deposition process of the wafer W of the preceding batch (batch 1) and immediately after the boat 24a is taken out from the film-deposition container 40, the boat 24b containing the wafer W of the following batch (batch 2) can be transported to the film-deposition container 40. As a result, the time needed for the film deposition process can be shortened and the manufacturing cost can be reduced.

The boats 24a and 24b are made of, for example, quartz, and are provided to install the wafers W (whose diameter is, for example, 300 mm) in the up/down direction at the predetermined intervals (pitch) in a horizontal state. The boats 24a and 24b interpose a plurality of supports 32 (for example, 3 supports) between the top plate 30 and the bottom plate 31, as shown in FIG. 4.

A claw part 33 for holding the wafer W is disposed in the support 32. Auxiliary posts 34 may be suitably formed together with the supports 32.

Each of the boats 24a and 24b is arranged so that a plurality of the plural-substrate units 36, each including two wafers W with adjacent back surfaces thereof stacked via the spacer member 35 on the claw parts 33, are held at predetermined intervals in the up/down direction.

In the following, the plural-substrate unit 36 of this embodiment will be an example of a stacked member in which the two wafers W each having a ring shape are stacked via the spacer member 35. The plural-substrate unit 36 is equivalent to the stacked member according to the present disclosure.

As shown in FIG. 5, the claw part 33 includes a bottom 33a and a wall part 33b, and the claw part 33 has an L-shaped vertical cross-section perpendicular to the hoop direction of the boat 24. The outer edge of the lower wafer W1 with the back surface Wb being the upper surface (and the front surface Wa is the lower surface) is supported on the bottom 33a.

The spacer member 35 is stacked on the lower wafer W1 on which the outer edge of the back surface Wb is supported on the bottom 33a. On the spacer member 35, the upper wafer W2 with the back surface Wb being the lower surface (and the front surface Wa is the upper surface) is supported. The wall part 33b is disposed near the side of the plural-substrate unit 36 (which is constituted by the lower wafer W1, the spacer member 35 and the upper wafer W2), and this wall part 33b is provided to prevents a positional error of the plural-substrate unit 36 in the horizontal direction.

The lower wafer W1 is equivalent to the first substrate according to the present disclosure, and the upper wafer W2 is equivalent to the second substrate according to the present disclosure.

Alternatively, a combination of wafers pasted together, other than a single wafer, may used as the wafer W. The wafer usually has a thickness of 0.75-1.2 mm.

As shown in FIGS. 5 and 6, the spacer member 35 has an outer diameter which is almost equal to the outer diameter of the wafer W, and has a ring shape the inside diameter of which is smaller than the outer diameter of the wafer W.

The ring-shaped portion of the spacer member 35 is interposed between the outer edge of the lower wafer W1 and the outer edge of the upper wafer W2 (these wafers W1 and W2 have adjacent back surfaces thereof stacked) when a film deposition process is carried out within the film-deposition container 40. Hence, the source gas enters the gap between the two wafers W1 and W2 with adjacent back surfaces thereof and it is possible to prevent a film from being formed on the back surfaces of the wafers W1 and W2. The spacer member 35 is made of SiC, silicon or quartz, for example.

As shown in FIG. 6, the spacer member 35 includes notches 35a and 35b. The notches 35a are formed so that when the spacer member 35 is supported by the second grip module 62, the spacer member 35 may not interfere with the first claw part 61a of the first grip module 61, and the notches 35b are formed so that when the spacer member 35 is supported by the second grip module 62, the spacer member 35 may not interfere with the first push part 61b of the first grip module 61, which will be described later with reference to FIG. 11.

As shown in FIG. 5, the thickness of the wafer W is set to Wt, the total thickness of one plural-substrate unit 36 is set to Pa, and the interval of the two plural-substrate units 36 held in the up/down direction (i.e., the interval of the claw parts 33) is set to Pb. At this time, the interval of the two wafers W with adjacent back surfaces thereof in the up/down direction is represented by (Pa−2Wt), and the interval of the two wafers W with adjacent front surfaces thereof in the up/down direction is represented by (Pb−Pa).

It is preferred that the arrangement is made so that the interval (Pa−2Wt) is smaller than the interval (Pb−Pa). Namely, it is preferred that the two wafers are held in the up/down direction so that the interval (Pa-2Wt) of the two wafers W with adjacent back surfaces thereof in the up/down direction is smaller than the interval (Pb−Pa) of the two wafers W with adjacent front surfaces thereof in the up/down direction.

In this embodiment, the arrangement is made so that the thickness Pa of one plural-substrate unit 36 is equal to 3.3 mm and the interval Pb of the plural-substrate units 36 held in the up/down direction (i.e., the interval of the claw parts 33) is equal to 21 mm. Hence, the interval (Pb−Pa) of the two wafers W with adjacent front surfaces thereof in the up/down direction is equal to (21−3.3)=17.7 mm. On the other hand, the interval (Pa−2Wt) of the two wafers W with adjacent back surfaces thereof in the up/down direction is (21−0.9×2)/2=9.6 mm, which is smaller than 17.7 mm.

Therefore, by supporting the two wafers W with adjacent back surfaces thereof using the plural-substrate unit 36, the interval between the front surface Wa of one wafer W and the front surface Wa of the other wafer W can be enlarged, and the source gas of sufficient quantity for the front surfaces Wa of the wafers W can be supplied. The transfer module 27 will be described later.

FIG. 7 is a cross-sectional view of the composition of the film-deposition container 40, the feed module 44, and the exhausting module 47.

The film-deposition container 40 can be made into the vertical mold furnace for accommodating a plurality of wafers W of a substrate, the shape of for example, a thin board disk, and, for example, performing predetermined processing, for example, CVD processing.

The film-deposition containers 40 includes a reaction tube 41 and a heater (heating device) 42. The reaction tube 41 is made of quartz, for example, and has a longwise form, and an opening 43 is formed at the lower end. The heater (heating device) 42 is provided to cover the circumference of the reaction tube 41, and control of the heater 42 can be performed to a predetermined temperature, for example, 100-1200 degrees C., in the inside of the reaction tube 41.

The feed module 44 includes a first source gas supplying portion 45 and a second source gas supplying portion 46. The first source gas supplying portion 45 is connected to the injector 45c via the valve 45b. The second source gas supplying portion 46 is connected to the injector 46c via the valve 46b.

The first source gas supplying portion 45 includes the first vaporizer 45a for evaporating PMDA material, for example. The first vaporizer 45a heats the first material containing PMDA to produce the vapor and supplies the first source gas containing PMDA gas to the reaction tube 41 together with the first carrier gas containing nitrogen gas (N2 gas). The second source gas supplying portion 46 includes the second vaporizer 46a for evaporating ODA material, for example.

The second vaporizer 46a heats the second material containing ODA to produce the vapor and supplies the second source gas containing ODA gas to the reaction tube 41 together with the second carrier gas that includes nitrogen gas (N2 gas). The second carrier gas is for bubbling of the liquid-state ODA and for transporting the second source gas containing ODA gas.

The exhausting module 47 includes an exhausting device 48 and an exhaust pipe 49 disposed in the film-deposition container 40. The exhausting module 47 is for exhausting gas from the inside of the film-deposition container 40.

The openings are formed on the side of each of the injectors 45c and 46c, and the PMDA gas produced by first source gas supplying portion 45 and the ODA gas produced by the second source gas supplying portion 46 are supplied to the wafer W as indicated by the arrows in FIG. 7. When a vapor-deposition-polymerization reaction of the PMDA gas and the ODA gas supplied is performed on the wafer W and a polyimide film is formed thereon. The PMDA gas and the ODA gas which do not contribute to the formation of the polyimide film are discharged outside the film-deposition container 40 from the exhaust pipe 49. The boat 24 is rotated by the rotation module 29 so that the polyimide film can be uniformly formed on the wafer W.

The control unit 50 includes, for example, an arithmetic processor, a memory part, and a display part (which are not illustrated). The arithmetic processor is, for example, a computer having a CPU (central processing unit). The memory part is, for example, a computer-readable recording medium, such as a hard disk, in which the program for causing the arithmetic processor to perform various kinds of processes, is stored. The display part includes, for example, a computer monitor screen. The arithmetic processor reads the program from on the memory part and performs the substrate transport method and the film deposition process (which will be described later) in accordance with the program to transmit a control signal to each of the boat 24 (substrate holding part), the transfer module 27, the feed module 44, and the exhausting module 47.

Next, with reference to FIGS. 8-11, the transfer module 27 will be described.

Figure 8:
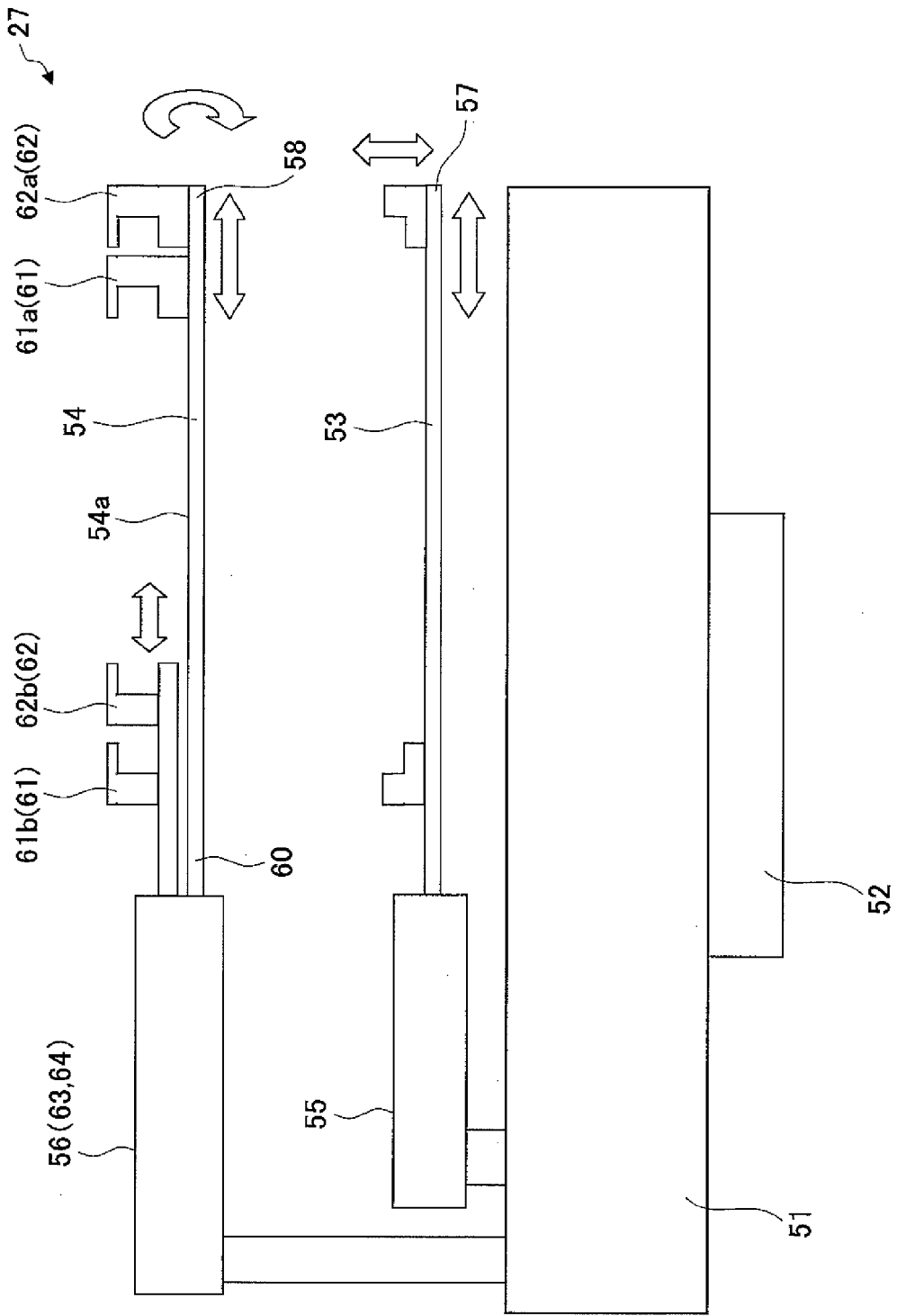
FIG. 8 is a side view of an example of a transfer module.
Figure 9A:
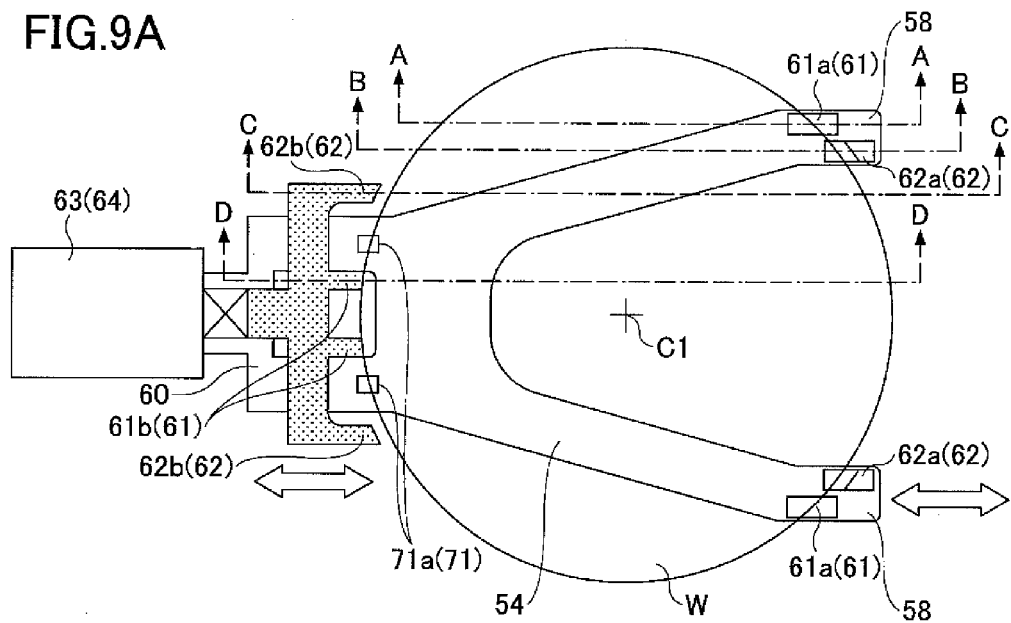
FIG. 9A, FIG. 9B and FIG. 9C are diagrams showing the state where the wafer is supported from a downward direction by an upper fork.
Figure 9B:
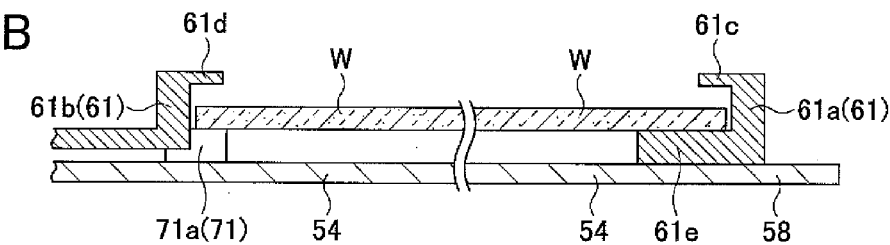
Figure 9C:
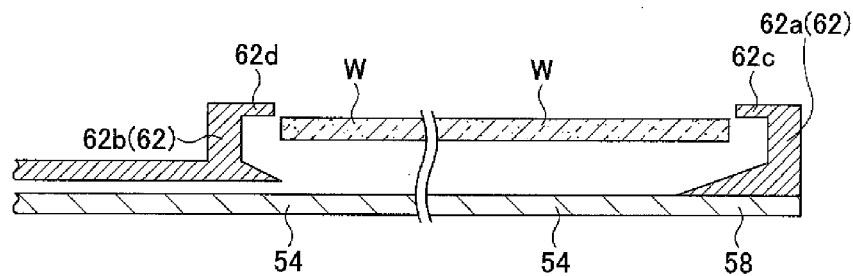
Figure 10A:
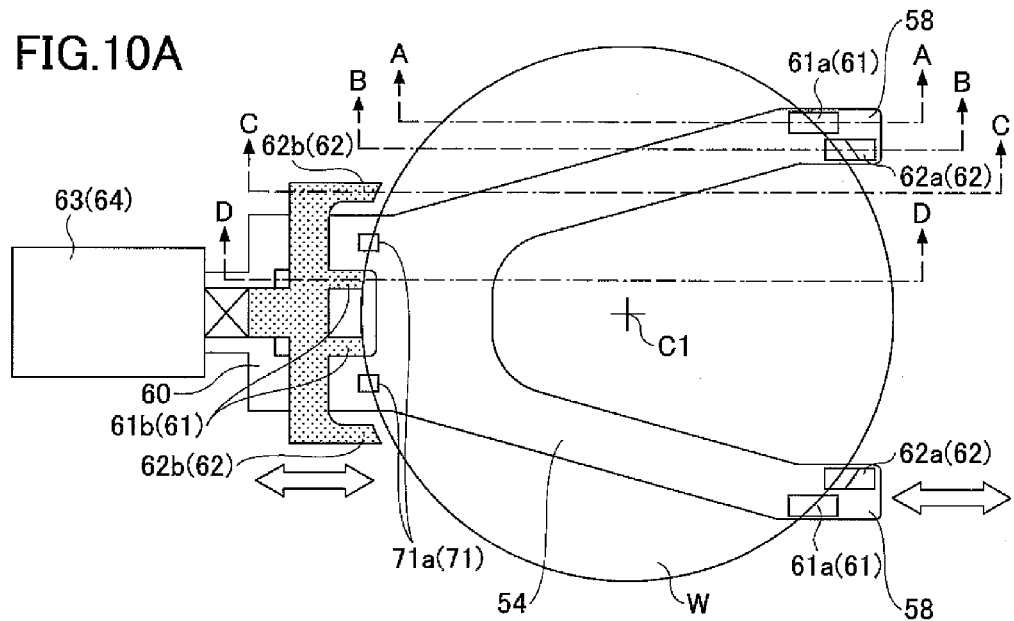
FIG. 10A, FIG. 10B and FIG. 10C are diagrams showing the state where the wafer is supported from an upward direction by the upper fork.
Figure 10B:
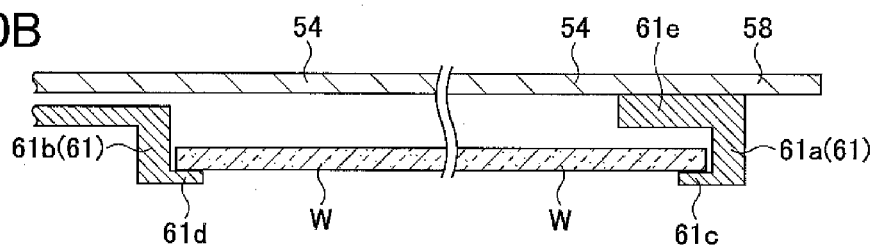
Figure 10C:
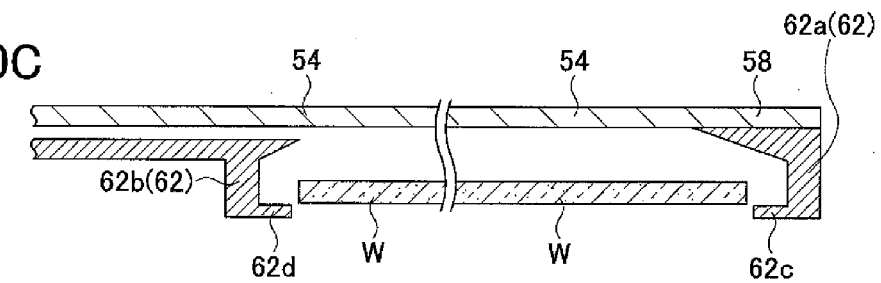
Figure 11A:
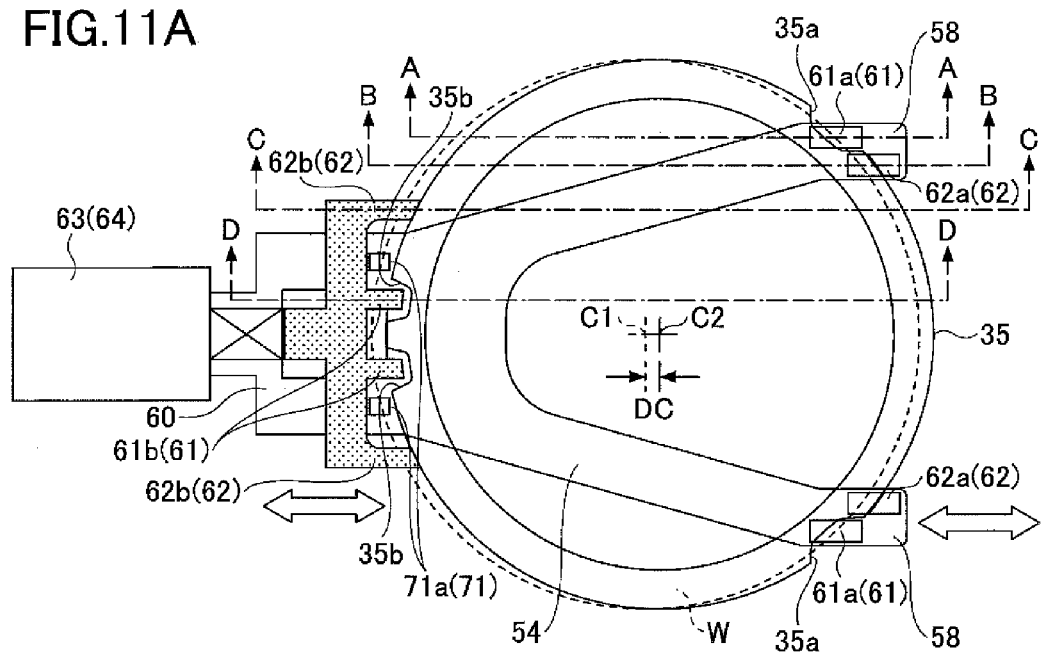
FIG. 11A, FIG. 11B and FIG. 11C are diagrams showing the state where a spacer member is supported from an upward direction by the upper fork.
Figure 11B:
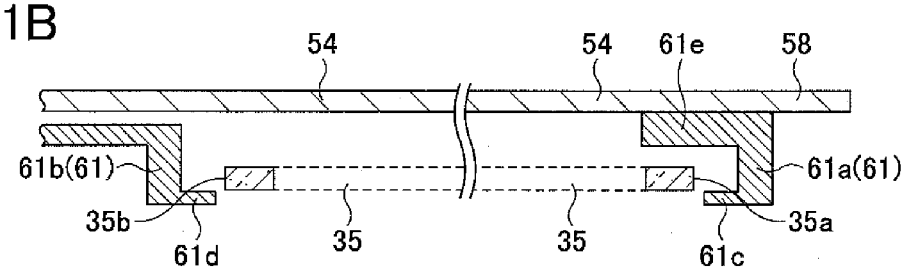
Figure 11C:
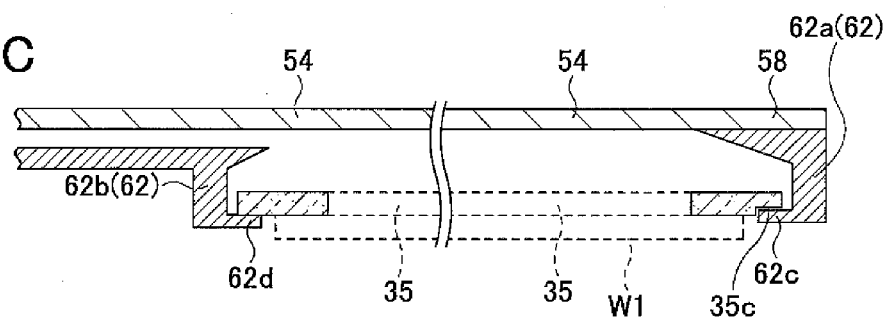

FIG. 8 is a side view showing an example of the transfer module 27. FIGS. 9A-9C are diagrams showing the state where the wafer W is supported from a downward direction by the upper fork 54 (lower gripping). FIGS. 10A-10C are diagrams showing the state where the wafer W is supported from an upward direction by the upper fork 54 (upper gripping). FIGS. 11A-11C are diagrams showing the state where the spacer member 35 is supported from an upward direction the upper fork 54 (upper gripping).

In FIGS. 9A-11C, the right half of each of FIGS. 9B-11B is a cross-sectional view of the upper fork taken along the A-A line in FIG. 9A-11A, respectively. The left half of each of FIGS. 9B-11B is a cross-sectional view of the upper fork taken along the D-D line in FIG. 9A-11A, respectively. The right half of each of FIGS. 9C-11C is a cross-sectional view of the upper fork taken along the B-B line in FIG. 9A-11A, respectively. The left half of each of FIGS. 9C-11C is a cross-sectional view of the upper fork taken along the C-C line in FIG. 9A-11A, respectively.

The transfer module 27 is provided for transferring the wafer W or the spacer member 35 between the accommodating containers 13 and 14 and the boats 24a and 24b. The transfer module 27 includes the base 51, the lifting/lowering module 52, the lower fork 53, and the upper fork 54.

The base 51 is arranged to be rotatable. The lifting/lowering module 52 is arranged to be movable in the up/down direction along the rail 52a (see FIG. 1) which extends in the up/down direction. The lower fork 53 is arranged to be movable horizontally and vertically to the base 51. The upper fork 54 is arranged to be reversible upside down and to be movable horizontally to the base 51.

The lower fork 53 is equivalent to the first fork according to the present disclosure, and the upper fork 54 is equivalent to the second fork according to the present disclosure. The transfer module of the present disclosure may be arranged so that one of the lower fork 53 and the upper fork 54 is arranged to be movable in the up/down direction to the other fork. Therefore, instead of the lower fork 53, the upper fork 54 may be arranged to be movable in the up/down direction to the base 51.

The lower fork 53 is provided to be movable in the forward/backward direction to the boats 24a and 24b carrying the plural-substrate unit 36 by the movable body 55, and the lower fork 53 transports the plural-substrate unit 36 between the boats 24a and 24b. On the other hand, the upper fork 54 is provided to be movable horizontally and movable in the forward/backward direction to the accommodating container 13 containing the wafers W by the movable body 56, and the upper fork 54 transports the wafer W to the accommodating container 13.

The upper fork 54 is provided to be movable in the forward/backward direction to the accommodating container 14 containing the spacer member 35 by the movable body 56, and the upper fork 54 transports the spacer member 35 to and from the accommodating container 14.

As shown in FIG. 9A, the front end 58 of the upper fork 54 is divided into a bifurcated condition. Although not illustrated, the front end 57 of the lower fork 53 is divided into a bifurcated condition similar to the upper fork 54.

The lower fork 53 includes a first grip module 61, a second grip module 62, and a support portion 71. The first grip module 61 includes two first claw parts 61a and two first push parts 61b. The first claw parts 61a are fixed to both the surfaces 54a of the front end 58 (divided into the bifurcated condition) of the upper fork 54. Each first push part 61b is disposed on the surface 54a side (on the base end 60 side of the upper fork 54) to be movable in the forward/backward direction to the first claw part 61a, and pinches the wafer W with the first claw part 61a by contacting the outer edge of the wafer W and pushing the wafer W on the first claw part 61a side. Alternatively, the two first push parts 61b may be formed into an integral part.

The second grip module 62 includes two second claw parts 62a and two second push parts 62b. The second claw parts 62a are fixed to the surface 54a side of the front end 58 (divided into the bifurcated condition) of the upper fork 54. Each second push part 62b is disposed on the surface 54a side (on the base end 60 side of the upper fork 54) to be movable in the forward/backward direction to the second claw part 62a, and pinches the wafer W with the second claw part 62a by contacting the outer edge of the wafer W and pushing the wafer W on the second claw part 62a side. Alternatively, the two second push parts 62b may be formed into an integral part.

Namely, the first grip module 61 is disposed on the surface 54a side of the upper fork 54 and arranged to hold and support the wafer W from the upward direction while the surface 54a is facing down. The second grip module 62 is disposed on the surface 54a side of the upper fork 54 on the same side where the first grip module 61 of the upper fork 54 is disposed, and arranged to hole and support the spacer member 35 from the upward direction while the surface 54a is facing down.

It is sufficient that the first claw part 61a and the first push part 61b are arranged to contact the outer edge of the wafer W at at least three places to pinch the wafer W. Namely, the first claw part 61a and the first push part 61b may be arranged so that the total of the number of the first claw parts 61a and the number of the first push parts 61b is three or more. It is sufficient that the second claw part 62a and the second push part 62b are arranged to contact the outer edge of the wafer W at at least three places to pinch the wafer W. Namely, the second claw part 62a and the second push part 62b may be arranged so that the total of the number of the second claw parts 62a and the number of the second push parts 62b is three or more.

The first grip module 61 includes a first forward/backward actuator 63 that performs the forward/backward drive of the first push part 61b to the first claw part 61a. The second grip module 62 includes a second forward/backward actuator 64 that performs the forward/backward drive of the second push part 62b to the second claw part 62a.

Alternatively, the first push part 61b and the second push part 62b may be arranged into one integral part. In such a case, the first forward/backward actuator 63 which performs the forward/backward drive of the first push part 61b and the second forward/backward actuator 64 that performs the forward/backward drive of the second push part 62b may be provided collectively.

In the example shown in FIGS. 8 through 11, the first push part 61b and the second push part 62b are arranged into one integral part, and the same forward/backward actuator 63 (64) is provided there.

It is sufficient that the first grip module 61 is able to hold and support the wafer W from the upward direction. Alternatively, the first grip module 61 may be arranged to include any additional parts other than the first claw part 61a and the first push part 61b. It is sufficient that the second grip module 62 is able to hold and support the spacer member 35 from the upward direction. Alternatively, the second grip module 62 may be arranged to include any additional parts other than the second claw part 62a and the second push part 62b.

The support portion 71 includes two contact parts 71a. The support portion 71 is provided as a portion on which the outer edge of the wafer W is mounted when the wafer W is held and supported from the downward direction.

When holding and supporting the wafer W from the downward direction, as shown in FIG. 9A and FIG. 9B, the wafer W pinched by the first claw part 61a and the first push part 61b is horizontally restrained. The undersurface of the wafer W contacts the bottom part 61e of the first claw part 61a and contacts the contact part 71a, and the wafer W is supported in the up/down direction.

On the other hand, as shown in FIGS. 9A and 9C, the wafer W does not contact the second claw part 62a or the second push part 62b, and the wafer W is not pinched by the second claw part 62a and the second push part 62b.

When holding and supporting the wafer W from the upward direction, as shown in FIG. 10A and FIG. 10B, the wafer W pinched by the first claw part 61a and the first push part 61b is horizontally restrained. The undersurface of the wafer W contacts the sword guard part 61c of the first claw part 61a and also contacts the sword guard part 61d of the first push part 61b, so that the wafer W is supported in the up/down direction.

On the other hand, as shown in FIGS. 10A and 10C, the wafer W is not in contact with the second claw part 62a or the second push part 62b, and the wafer W is not pinched by the second claw part 62a and the second push part 62b.

When holding and supporting the spacer member 35 from the upward direction, as shown in FIGS. 11A and 11C, the spacer member 35 pinched by the second claw part 62a and the second push part 62b is horizontally restrained. The undersurface of the spacer member 35 contacts the sword guard part 62c of the second claw part 62a and also contacts the sword guard part 62d of the second push part 62b, so that the spacer member 35 is supported in the up/down direction.

On the other hand, as shown in FIG. 11A and FIG. 11B, because the notches 35a and 35b are formed in the spacer member 35 as shown in FIG. 6, the spacer member 35 is not in contact with the first claw part 61a or the first push part 61b, and the spacer member 35 is not pinched by the first claw part 61a and the first push part 61b.

Alternatively, the portion of the spacer member 35 in contact with the sword guard part 62c of the second claw part 62a may be formed into a notch 35c the upper part of which is cut off. In such a case, when receiving the plural-substrate unit 36 from the boat 24 and accommodating the spacer member 35 in the accommodating container 14, the spacer member 35 on the wafer W1 can be easily supported from the upward direction.

The first grip module 61 and the second grip module 62 are arranged so that the center C1 of the wafer W supported by the first grip module 61 and the center C2 of the spacer member 35 supported by the second grip module 62 are different from each other along the forward/backward direction of the upper fork 54.

When the spacer member 35 is pinched by the second claw part 62a and the second push part 62b, the spacer member 35 can be prevented from interfering with any of the first claw part 61a and the first push part 61b. For example, when the outer diameter of the wafer W is equal to 300 mm, the distance DC between the center C1 and the center C2 can be 2 mm.

Figure 12A:
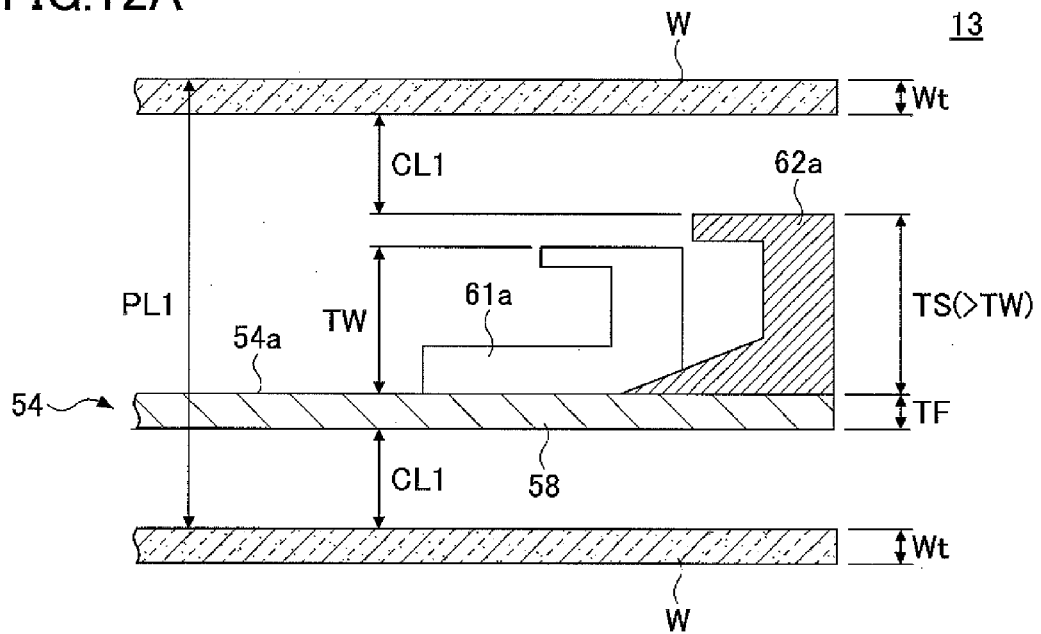
FIG. 12A and FIG. 12B are vertical cross-sectional views showing the front end of the upper fork of the transfer module of this embodiment and a front end of an upper fork of a transfer module of an comparative example respectively.
Figure 12B:
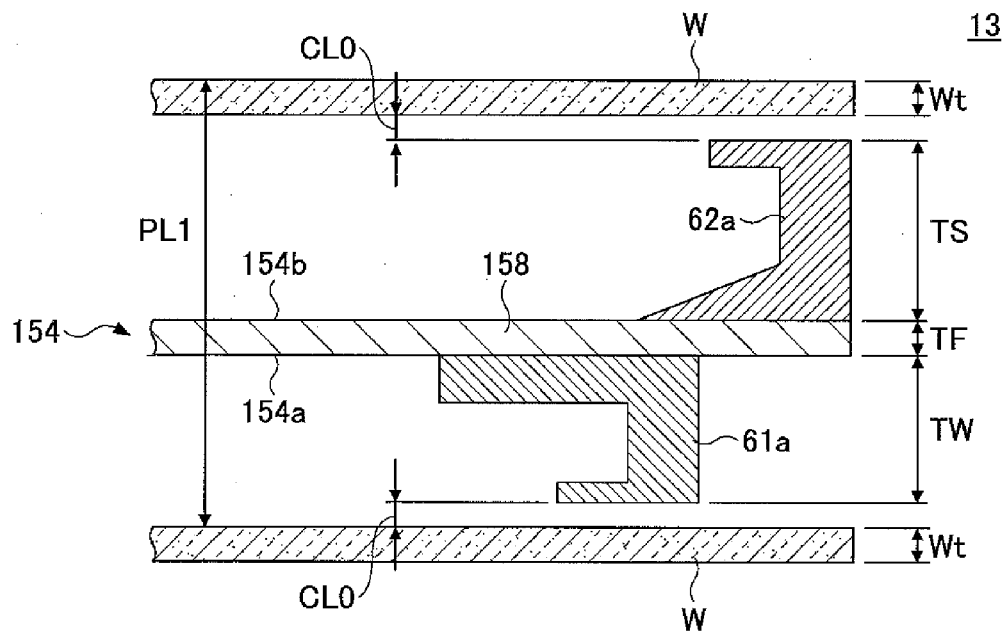

The transfer module of this embodiment will be described with reference to FIGS. 12A and 12B. FIGS. 12A and 12B are vertical cross-sectional views showing the front end 58 of the upper fork 54 of the transfer module 27 of this embodiment and a front end 158 of an upper fork 154 of a transfer module of a comparative example respectively. Each thickness of the front ends 58 and 158 is set to TF, the maximum thickness of the first claw part 61a is set to TW, and the maximum thickness of the second claw part 62a is set to TS.

The maximum thickness TS of the second claw part 62a is larger than the maximum thickness TW of the first claw part 61a, namely TS>TW. For example, the thickness of 1.5 mm of the spacer member 35 is larger than the thickness of the wafer W which is equal to 0.9 mm.

As shown in FIG. 12B, in the transfer module of the comparative example, the first claw part 61a and the second claw part 62a are prepared for each other of the upper fork 154 on the surfaces 154a and 154b of the opposite sides. Therefore, the thickness in the front end 158 of the upper fork 154 is equal to TS+TF+TW.

On the other hand, as shown in FIG. 12A, in the transfer module 27 of this embodiment, the first claw part 61a and are second claw part 62a are disposed on the same surface 54a of the upper fork 54. Therefore, the thickness of the front end 58 of the upper fork 54 is equal to TS+TF because of TS>TW. Namely, the thickness (TS+TF) of the upper fork 54 of the transfer module 27 of this embodiment can be made smaller than the thickness (TS+TF+TW) of the upper fork 154 of the transfer module of the comparative example. Therefore, the intervals of the wafers W and the spacer member 35 in the accommodating containers 13 and 14 can be made small.

A pitch between upper and lower wafers W accommodated in the up/down direction in the accommodating container 13 (in which wafers are accommodated) is predetermined. It is assumed that the predetermined pitch is set to PL1 and the thickness of the wafer W is set to Wt. In the comparative example shown in FIG. 12B, a clearance CL0 between the upper fork 154 and each of the upper and lower wafers W in the accommodating container 13 is represented by (PL1−Wt−(TS+TF+TW))/2.

On the other hand, in the present embodiment shown in FIG. 12A, a clearance CL1 between the upper fork 54 and each of the upper and lower wafers W in the accommodating container 13 is represented by (PL1−Wt−(TS+TF))/2. CL1 is larger than CL0. Accordingly, the clearance CL1 in the accommodating container 13 of the upper fork 54 of the transfer module 27 of this embodiment can be made larger than the clearance CL0 in the accommodating container 13 of the upper fork 154 of the transfer module of the comparative example. The same discussion is also applicable to the accommodating container 14 which accommodates the spacer member 35.

For example, when PL1 is equal to 10 mm and Wt is equal to 0.9 mm, the dimension (TS+TF+TW) in the comparative example is equal to 7.2 mm, and the dimension (TS+TF) in this embodiment is equal to 5.3 mm. In such a case, CL0 in the comparative example is equal to 0.95 mm, and CL1 in this embodiment is equal to 1.9 mm. Accordingly, CL1 is larger than CL0.

Next, the substrate transport method in which the transfer module 27 constitutes and transports the plural-substrate unit 36 will be described with reference to FIGS. 13A through 20B.

FIGS. 13A through 19C are side views showing the procedure in which the transfer module 27 constitutes the plural-substrate unit 36 and transports the plural-substrate unit 36. FIGS. 20A and 20B are diagrams showing a movement of the upper fork 54 and the second push part 62b when the upper fork 54 transports the wafer W to the lower fork 53. FIG. 20A shows the state thereof before the upper fork 54 transports the wafer W to the lower fork 53, and FIG. 20B shows the state thereof after the upper fork 54 transports the wafer W to the lower fork 53.

At first, the upper fork 54 is advanced in the accommodating container 13, and the wafer W1 is supported from the downward direction by the first grip module 61. The upper fork 54 is returned and turned upside down, so that the wafer W1 is arranged in the lower fork 53 (the first process).

Figure 13A:
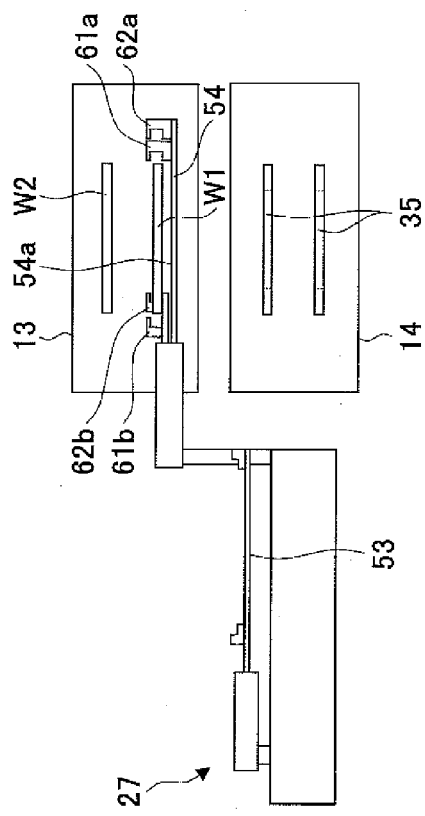
FIG. 13A, FIG. 13B and FIG. 13C are side views showing the procedure in which the transfer module constitutes and transports the plural-substrate unit.
Figure 13A:
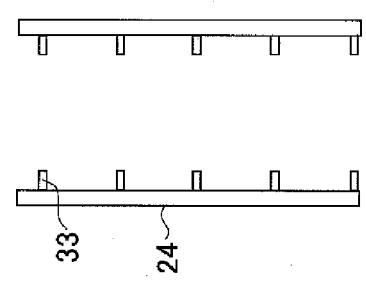
Figure 13B:
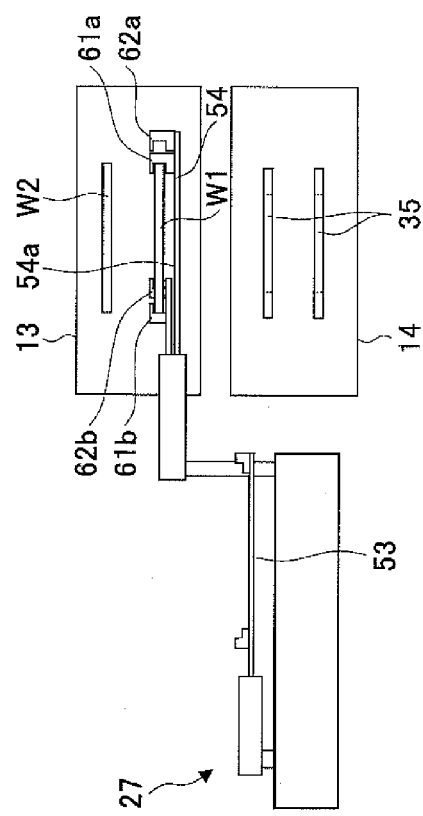
Figure 13B:
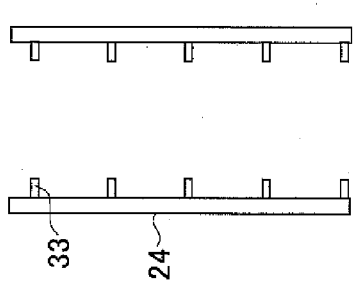
Figure 13C:
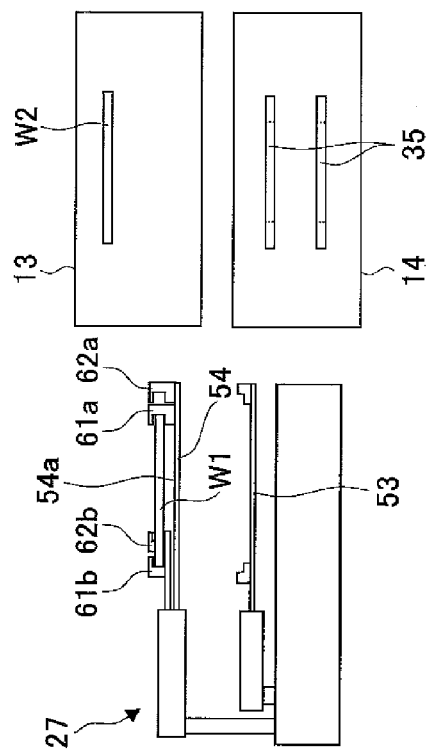

The upper fork 54 facing the surface 54a up is advanced in the accommodating container 13 in which the wafer W1 is accommodated, (FIG. 13A). At this time, the upper form 54 is moved forward so that the wafer W1 is located between the first claw part 61a and the first push part 61b. Subsequently, the first push part 61b is advanced to push the wafer W1 on the first claw part 61a side and the wafer W1 is supported from the downward direction (FIG. 13B). Subsequently, the upper fork 54 is retracted out of the accommodating container 13 while the wafer W1 is supported (FIG. 13C).

Figure 14A:
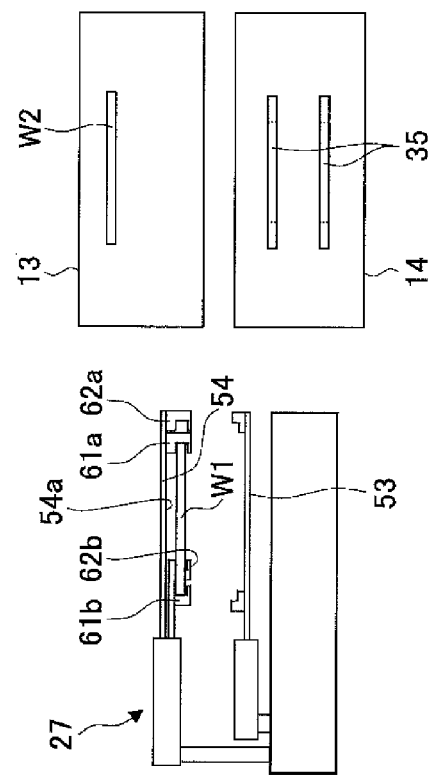
FIG. 14A, FIG. 14B and FIG. 14C are side views showing the procedure in which the transfer module constitutes and transports the plural-substrate unit.
Figure 14B:
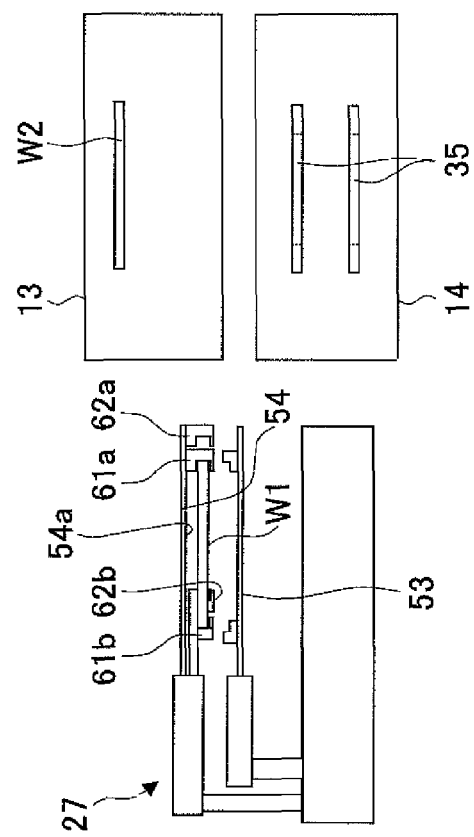
Figure 14B:
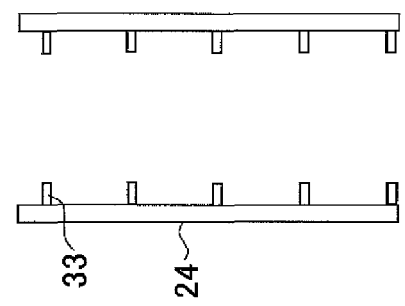
Figure 14C:
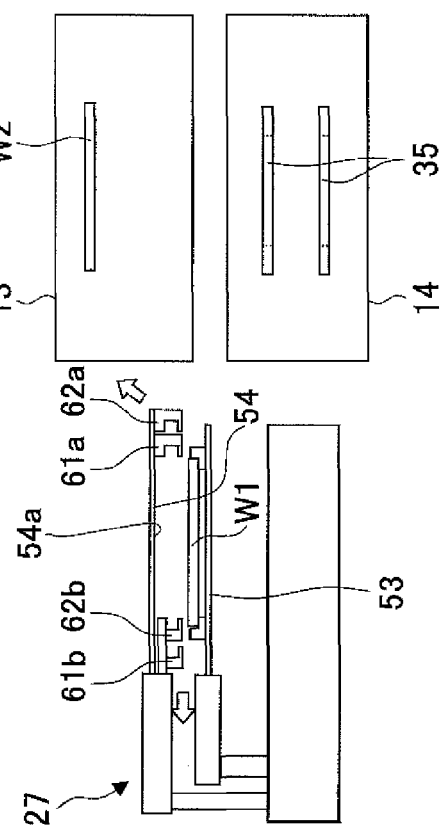
Figure 14C:
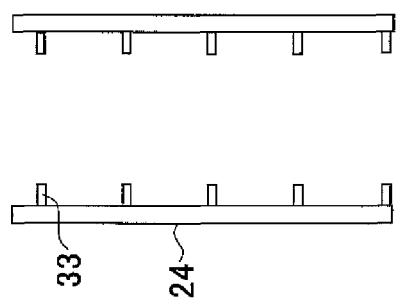

Subsequently, the upper fork 54 is turned upside down while the wafer W1 is supported (FIG. 14A). Subsequently, the lower fork 53 is lifted and brought close to the upper fork 54 (FIG. 14B). Subsequently, the first push part 61b is retracted and the wafer W1 is arranged on the lower fork 53 (FIG. 14O). Subsequently, the lower fork 53 is lowered to the original position (FIG. 15A).

Before the upper fork 54 transports the wafer W1 to the lower fork 53, the wafer W1 is pinched by the first claw part 61a and the first push part 61b, as shown in FIG. 20A. When the upper fork 54 transports the wafer W1 to the lower fork 53, the first push part 61b is returned and simultaneously the upper fork 54 is slightly advanced by the movable body 56 and the transfer module 27 is slightly lifted by the lifting/lowering module 52, as shown in FIG. 20B.

When the wafer W1 is transported to the lower fork 53, the wafer W1 can be prevented from interfering with both the first claw part 61a and the first push part 61b. The same discussion is also applicable to the case where the spacer member 35 or the wafer W2 is transported from the upper fork 54 to the lower fork 53 (see FIG. 16O and FIG. 18C).

As described above, instead of the lower fork 53, the upper fork 54 may be formed to be movable up and down to the base 51. In this case, after the upper fork 54 is lowered and brought close to the lower fork 53 and the first push part 61b is retracted to place the wafer W1 on the lower fork 53, the upper fork 54 may be lifted to the original position. The same discussion is also applicable to the case where the spacer member 35 or the wafer W2 is transported from the upper fork 54 to the lower fork 53 (see FIG. 16O and FIG. 18C).

Subsequently, the upper fork 54 is advanced in the accommodating container 14, the spacer member 35 is supported from the upward direction by the second grip module 62, and the upper fork 54 is retracted, so that the spacer member 35 is arranged on the wafer W1 arranged on the lower fork 53 (the second process).

Figure 15C:
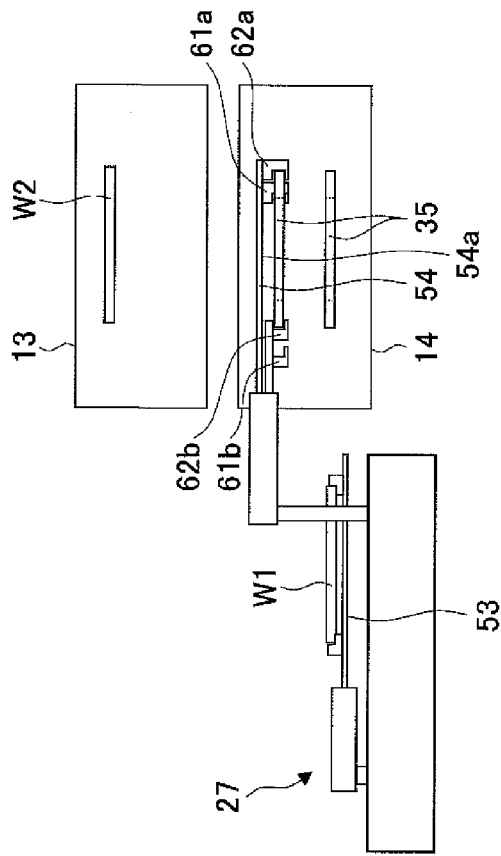
FIG. 15A, FIG. 15B and FIG. 15O are side views showing the procedure in which the transfer module constitutes and transports the plural-substrate unit.

The upper fork 54 facing the surface 54a down is advanced in the accommodating container 14 in which the spacer member 35 is accommodated (FIG. 15B). At this time, the upper fork 54 is moved forward so that the spacer member 35 is located between the second claw part 62a and the second push part 62b. Subsequently, the second push part 62b is advanced to push the spacer member 35 to the second claw part 62a side and the spacer member 35 is supported from the upward direction (FIG. 15C).

Figure 16A:
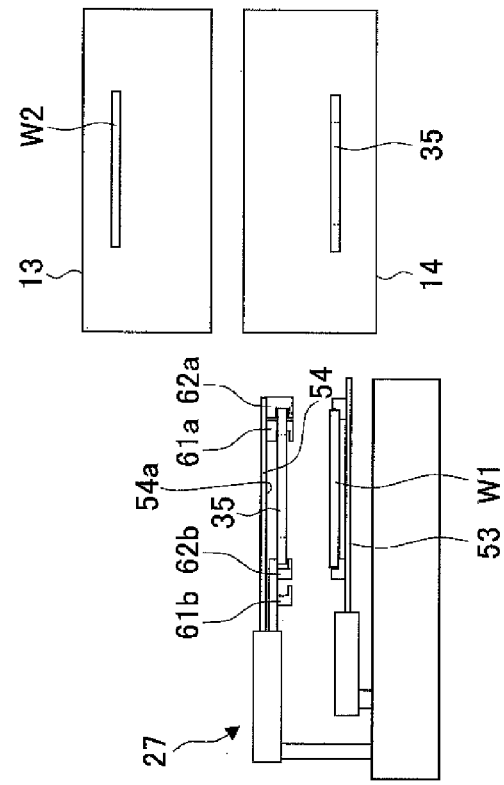
Figure 17A:
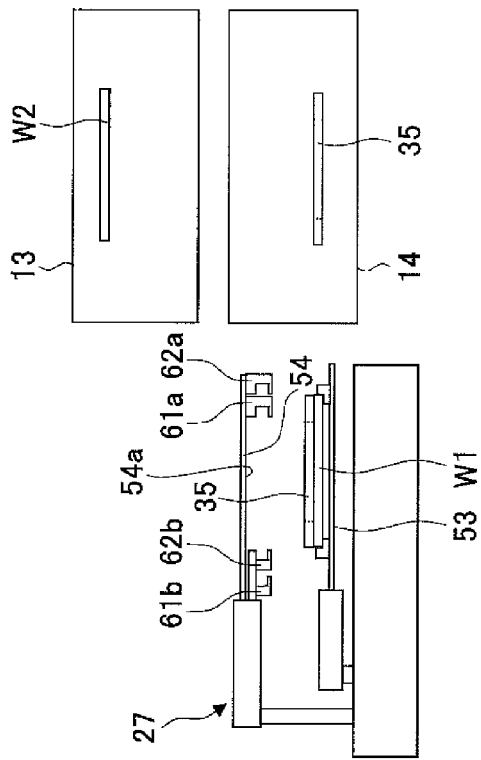
FIG. 17A, FIG. 17B and FIG. 17C are side views showing the procedure in which the transfer module constitutes and transports the plural-substrate unit.
Figure 17A:
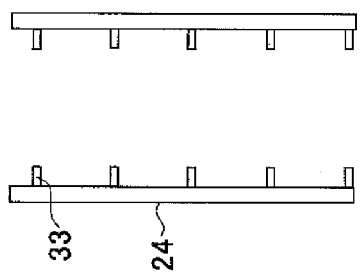

Subsequently, the upper fork 54 is retracted out of the accommodating container 14 while the spacer member 35 is supported (FIG. 16A). Subsequently, the lower fork 53 is lifted and brought close to the upper fork 54 (FIG. 16B). Subsequently, the second push part 62b is retracted and the spacer member 35 is arranged on the wafer W1 on the lower fork 53 (FIG. 16C). Subsequently, the lower fork 53 is lowered to the original position (FIG. 17A).

In the second process, when the center C2 of the spacer member 35 supported by the second grip module 62 is located along the forward/backward direction of the upper fork 54 at a different position from the center C1 of the wafer W1 supported by the first grip module 61, the spacer member 35 is received. Accordingly, when the spacer member 35 is pinched by the second claw part 62a and the second push part 62b, the spacer member 35 can be prevented from interfering with any of the first claw part 61a and the first push part 61b.

Subsequently, the upper fork 54 is advanced in the accommodating container 13, and the wafer W2 is supported from the upward direction by the first grip module 61, the upper fork 54 is retracted, and the wafer W2 is arranged on the spacer member 35 on the lower fork 53 (the third process).

Figure 17B:
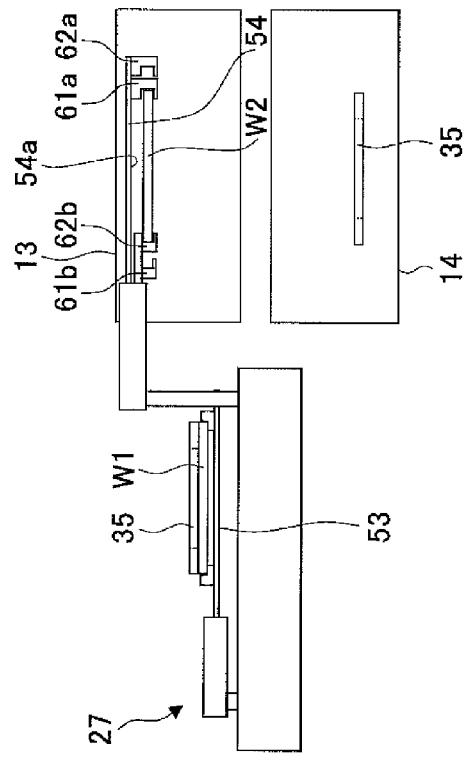
Figure 17B:
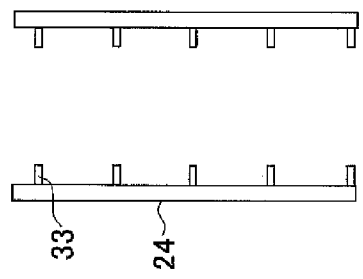
Figure 17C:
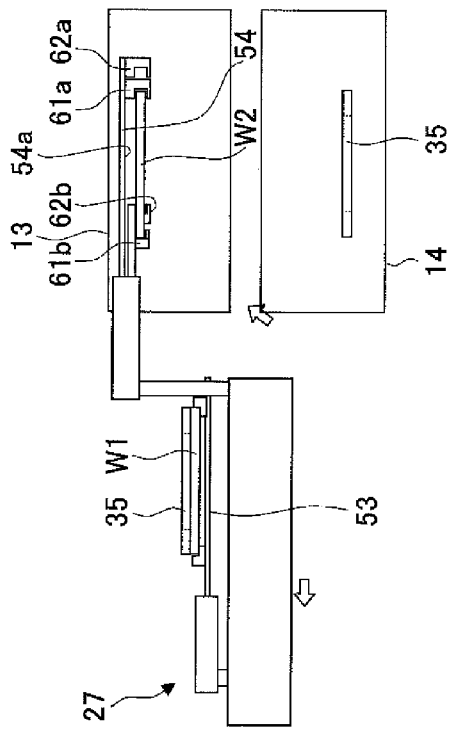
Figure 17C:
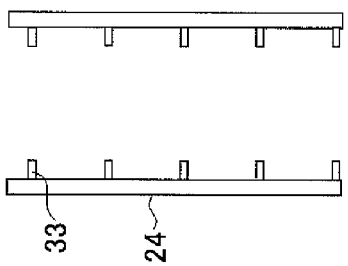

The upper fork 54 facing the surface 54a down is advanced in the accommodating container 13 in which the wafer W2 is accommodated (FIG. 17B). At this time, the upper fork 54 is moved forward so that the wafer W2 is located between the first claw part 61a and the first push part 61b. Subsequently, the first push part 61b is advanced to push the wafer W2 on the first claw part 61a side so that the wafer W2 is supported from the upward direction (FIG. 17C).

Figure 18A:
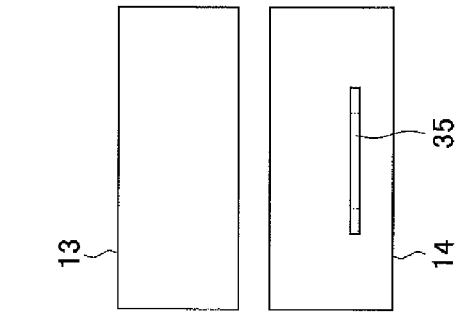
Figure 18A:
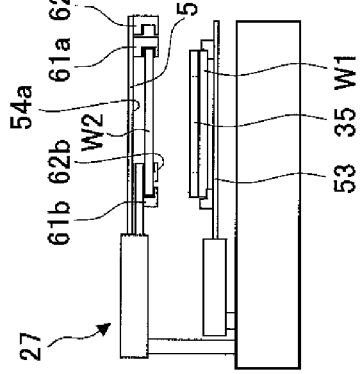
Figure 18A:
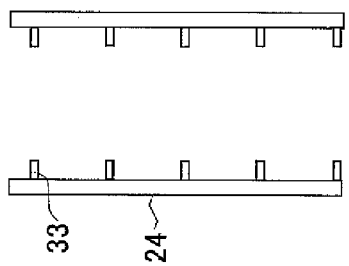

Subsequently, the upper fork 54 is retracted out of the accommodating container 13 while the wafer W2 is supported (FIG. 18A). Subsequently, the lower fork 53 is lifted and brought close to the upper fork 54 (FIG. 18B). Subsequently, the first push part 61b is retracted and the wafer W2 is arranged on the spacer member 35 on the lower fork 53 (FIG. 18C). Subsequently, the lower fork 53 is lowered to the original position (FIG. 19A).

Subsequently, the lower fork 53 is advanced in the boat 24, and the plural-substrate unit 36 is transported to the claw part 33 (the fourth process).

Figure 19C:
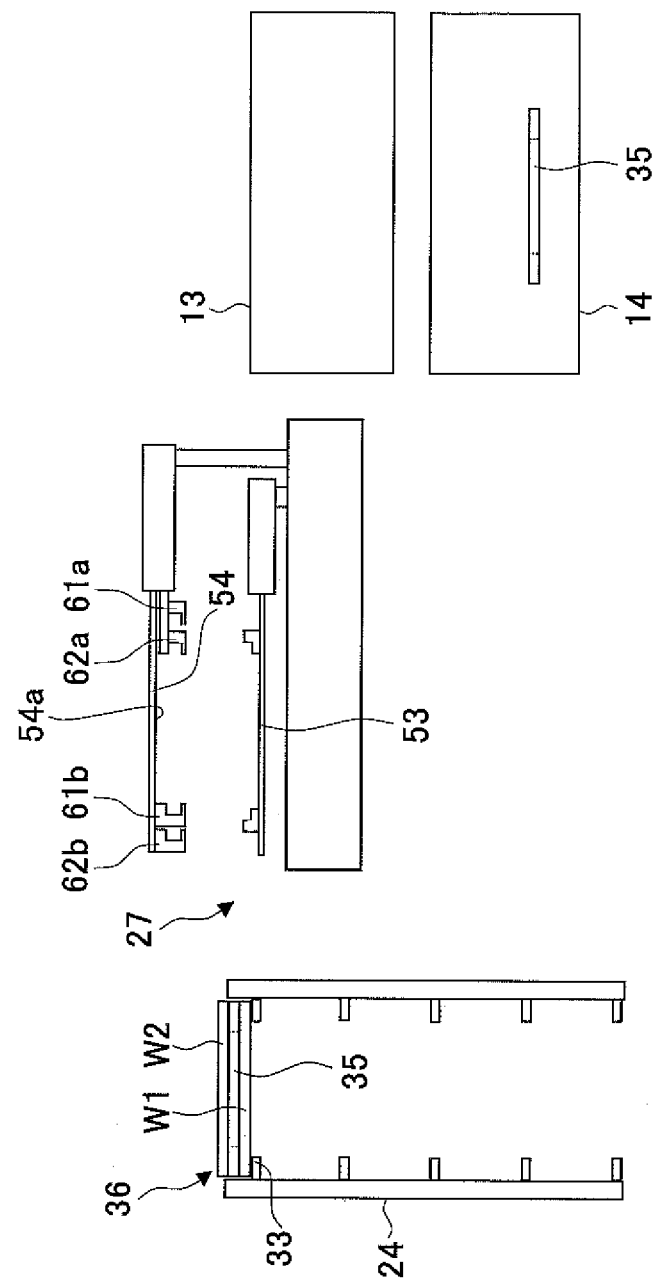
Figure 20A:
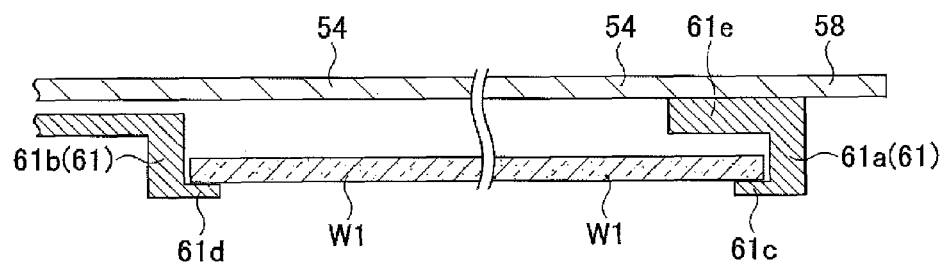
FIG. 20A and FIG. 20B are diagrams showing a movement of the upper fork and the first push part when the upper fork transports the wafer to the lower fork.
Figure 20B:
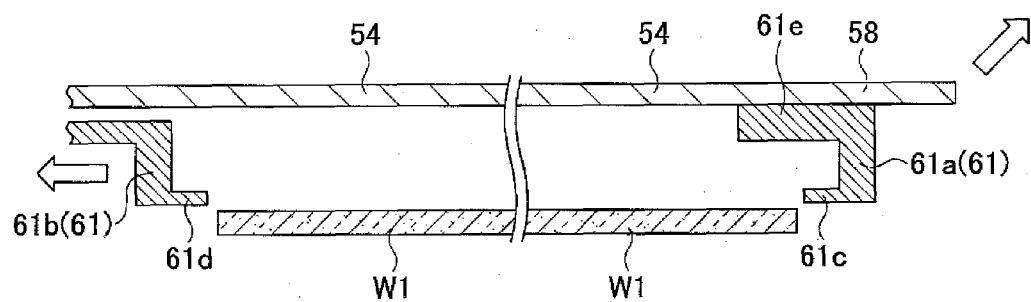

The lower fork 53 is advanced in the boat 24, and the plural-substrate unit 36 (which includes the wafer W1, the spacer member 35, and the wafer W2) is transported to the claw part 33 (FIG. 19B). Subsequently, the lower fork 53 is retracted out of the boat 24 (FIG. 19C).

Figure 21:
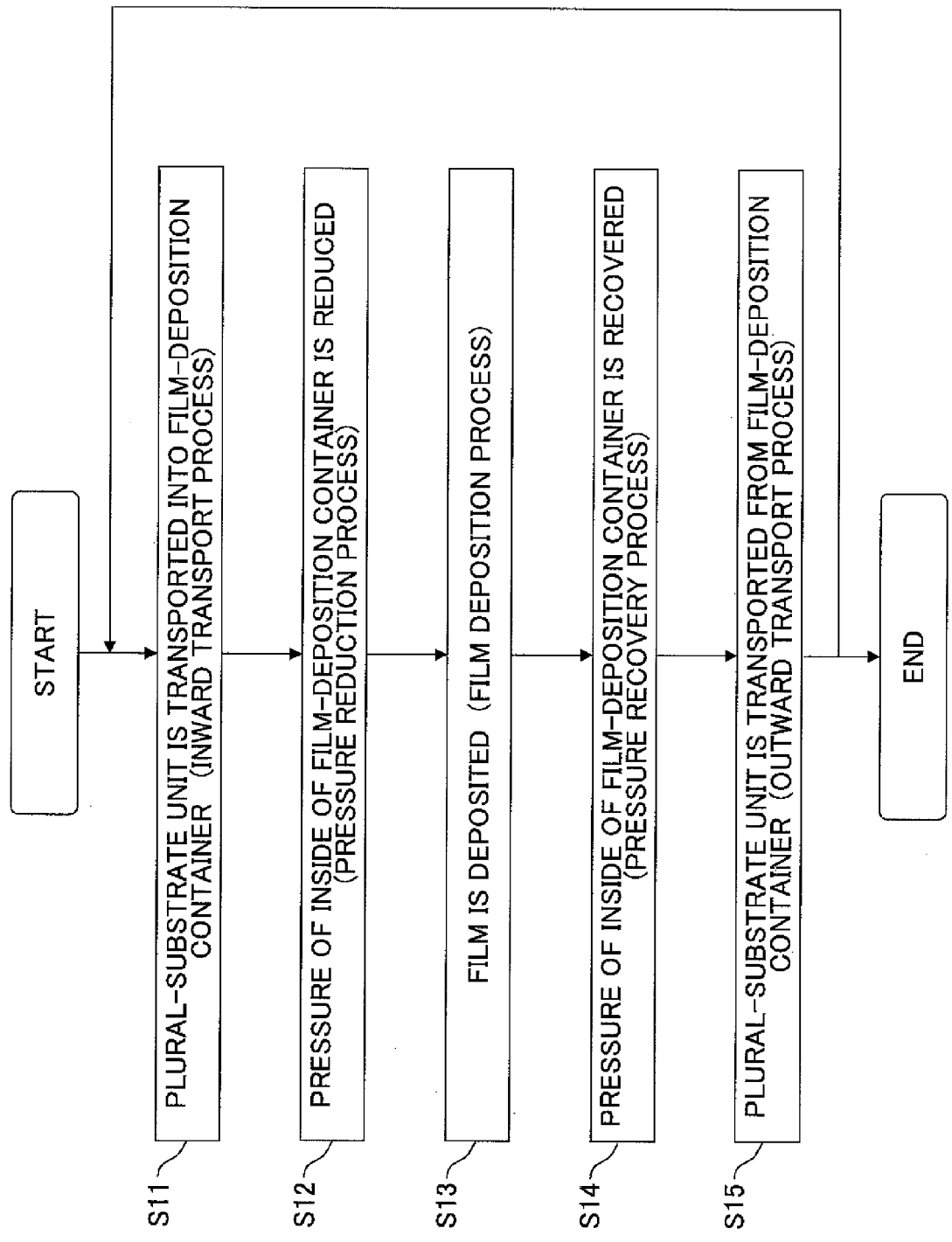
FIG. 21 is a flow chart for explaining the film deposition process using the film deposition apparatus of this embodiment.

Next, the film deposition process using the film deposition apparatus of this embodiment will be described. FIG. 21 is a flow chart for explaining the procedure of each process including the film deposition process using the film deposition apparatus of this embodiment.

Upon start of the film deposition process, at step S11, the plural-substrate unit 36 is transported into the film-deposition container 40 (inward transport process). As shown in FIGS. 1 through 4, in the film deposition apparatus 10, the plural-substrate unit 36 is loaded in the boat 24a in the loading area 20 by the transfer module 27, and the boat 24a carrying the plural-substrate unit 36 is transported to the lid 23 by the boat transport module 25c. The wafer W is transported by raising the lid 23 carrying the boat 24a by the lifting/lowering module 26 to insert the boat 24a into the film-deposition container 40. The procedure as shown in FIGS. 13A through 19C can be performed to transfer the wafer W and the spacer member 35 from the accommodating containers 13 and 14 to the boat 24a.

Subsequently, at step S12, the inside pressure of the film-deposition container 40 is reduced (pressure reduction process). By adjusting the exhaust capability of the exhausting device 48 or adjusting the flow rate regulating valve (not illustrated) which is provided between the exhausting device 48 and the exhaust pipe 49, the exhausting volume for exhausting gas from the film-deposition container 40 via the exhaust pipe 49 is increased. The inside pressure of the film-deposition container 40 is reduced from atmospheric pressure (760 Torr) to a predetermined pressure (for example, 0.3 Torr).

Subsequently, at step S13, a polyimide film is formed (film deposition process). Beforehand, or in step S13, a first flow rate F1 that passes the first source gas (PMDA gas) to the injector 45c, and a second flow rate F2 that passes the second source gas (ODA gas) to the injector 46c are set up by the control unit 50. PMDA gas is passed from the first source gas supplying portion 45 to the injector 45c at the first flow rate F1 while the wafer W is rotated by the rotation module 29, and ODA gas is passed from the second source gas supplying portion 46 to the injector 46c at the second flow rate F2. Hence, PMDA gas and ODA gas which are mixed together at a predetermined mixing ratio are supplied to the film-deposition container 40.

The polymerization reaction of PMDA and ODA is carried out on the surface of the wafer W, so that a polyimide film is formed. Specifically, the first flow rate F1 can be set to 900 sccm, and the second flow rate F2 can be set to 900 sccm.

The polymerization reaction of PMDA and ODA at this time follows the following formula (1).

Subsequently, at step S14, supply of the PMDA gas from the first source gas supplying portion 45 and supply of the ODA gas from the second source gas supplying portion 46 are suspended, and pressure recovery of the inside pressure of the film-deposition container 40 is carried out to atmospheric pressure (pressure recovery process).

By adjusting the exhaust capability of the exhausting device 48 or adjusting the flow rate regulating valve (not illustrated) which is provided between the exhausting device 48 and the exhaust pipe 49, the exhausting volume for exhausting gas from the film-deposition container 40 is decreased, and pressure recovery of the inside pressure (for example, 0.3 Torr) of the film-deposition container 40 is carried out to atmospheric pressure (760 Torr).

Subsequently, at step S15, the plural-substrate unit 36 is taken out from the film-deposition container 40 (the outward transport process). For example, in the film deposition apparatus 10 as shown in FIGS. 1 through 4, the lid 23 carrying the boat 24a can be lowered by the lifting/lowering module 26, and the boat 24a can be taken out from the inside of the film-deposition container 40 and placed in the loading area 20. By using the transfer module 27, the wafer W is transported from the boat 24a carried on the lid 23 to the accommodating container 13 and the plural-substrate unit 36 is taken out from the film-deposition container 40.

The procedure which is opposite to the procedure shown in FIG. 13A through 19C can be performed to transport the wafer W and the spacer member 35 from the boat 24a to the accommodating containers 13 and 14. Then, the film deposition process is terminated.

When the film deposition process is performed continuously for a plurality of batches, the wafer W from the accommodating container 13 in the loading area 20 is further transferred to the boat 24 by the transfer module 27, the control is returned to the step S11, and the film deposition process of the following batch is performed.

As described in the foregoing, according to the present disclosure, the substrate transport apparatus and the substrate transport method are able to support both the substrate and the spacer member with the same fork and able to reduce the

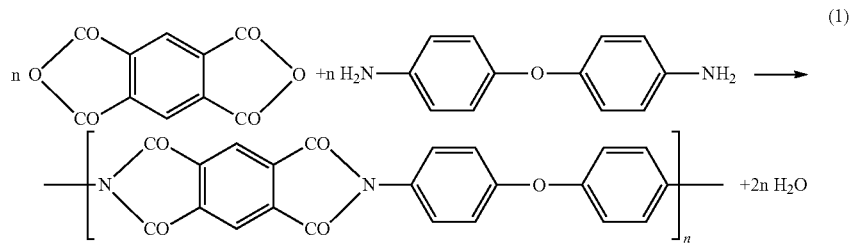

(1)

In this embodiment, the plurality of wafers W can be held in the up/down direction so that the interval of the two adjacent wafers W with adjacent back surfaces thereof stacked in the up/down direction is smaller than the interval of the two adjacent wafers W with adjacent front surfaces thereof stacked in the up/down direction.

Therefore, it is possible to increase the interval of the two adjacent wafers W with adjacent front surfaces thereof stacked in the up/down direction when the loading number of wafers of the boat 24 remains unchanged. As a result, the interval between the front surface of one wafer W and the front surface of the other wafer W can be enlarged, and the source gas of sufficient quantity can be supplied to the front surface of each wafer W.

interval between the substrate and the spacer member accommodated in the accommodating container.

The present invention is not limited to the above-described embodiments, and variations and modifications may be made without departing from the scope of the present invention.

In the above-described embodiment, the case in which the transfer module transfers the plural-substrate unit to the boat of the film deposition apparatus. However, the substrate transport apparatus of the present disclosure is applicable to transport a plural-substrate unit to or from a substrate holding part in which a plurality of stacked members, each stacked member including two substrates with adjacent back surfaces thereof stacked via a spacer member, are held at predetermined holding intervals in an up/down direction.

Therefore, the substrate transport apparatus of the present disclosure may be applicable to another kind of a substrate processing device including the above-described substrate holding part other than the boat of the film deposition apparatus in the foregoing embodiment.

What is claimed is:

1. A substrate transport apparatus which transports a set of a plurality of sets of stacked members to a substrate holding part containing a plurality of said sets of stacked members, each set of stacked members including two substrates with adjacent back surfaces thereof stacked via a spacer member, where the plurality of sets of the stacked members are held at predetermined intervals in an up/down direction, the substrate transport apparatus comprising:

a first fork disposed to be movable in a forward/backward direction to the Substrate holding part to transport the set of stacked members to or receive the set of stacked members from the substrate holding part;

a second fork arranged to be reversible and disposed above the first fork to be movable in a forward/backward direction to an accommodating part that accommodates the substrates and the spacer members, to transport the substrates or a spacer member between the accommodating part and the first fork;

a first grip module disposed on a first surface of the second fork to hold and support the substrates in a state where the first surface of the second fork faces downward and the first surface of the second fork is located above the substrates; and a second grip module disposed on the first surface of the second fork on the same side as the first grip module to hold and support the spacer member in the state where the first surface of the second fork faces downward and the first surface of the second fork is located above the substrates.

2. The substrate transport apparatus according to claim 1, wherein the first grip module includes a first claw part and a first push part, the first claw part being fixed to a front end of the second fork, and the first push part being disposed at a base end portion of the second fork to be movable in a forward/backward direction to the first claw part and arranged to pinch the substrates with the first claw part by pushing the substrates on the first claw part; and the second grip module includes a second claw part and a second push part, the second claw part being fixed to the front end of the second fork, and the second push part being disposed at the base end portion of the second fork to be movable in a forward/backward direction to the second claw part and arranged to pinch the spacer member with the second claw part by pushing the spacer member on the second claw part.

3. The substrate transport apparatus according to claim 1, wherein a center of the spacer member supported by the second grip module is arranged in a different position from a center of the substrates supported by the first grip module.

4. The substrate transport apparatus according to claim 1, wherein the spacer member has a ring shape.

5. The substrate transport apparatus according to claim 1, wherein the substrate holding part holds the plurality of stacked members so that an interval between two adjacent ones of the substrates with adjacent back surfaces thereof stacked in the up/down direction is smaller than an interval between two adjacent ones of the substrates with adjacent front surfaces thereof stacked in the up/down direction.

6. The substrate transport apparatus according to claim 1, wherein one of the first fork and the second fork is arranged to be movable in an up/down direction to the other fork.

7. The substrate transport apparatus according to claim 1, further comprising a lifting/lowering module arranged to lift or lower the first fork and the second fork together.

* * * * *